(12) United States Patent
Yamada

(10) Patent No.: US 12,562,354 B2
(45) Date of Patent: Feb. 24, 2026

(54) PLASMA PROCESSING APPARATUS AND TEMPERATURE CONTROLLING METHOD

(71) Applicant: Tokyo Electron Limited, Tokyo (JP)

(72) Inventor: Kazuhito Yamada, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 402 days.

(21) Appl. No.: 18/224,070

(22) Filed: Jul. 20, 2023

(65) Prior Publication Data

US 2024/0030009 A1 Jan. 25, 2024

(30) Foreign Application Priority Data

Jul. 22, 2022 (JP) ................................ 2022-116865

(51) Int. Cl.

| | |
|---|---|
| *H01J 37/32* | (2006.01) |
| *H05B 1/02* | (2006.01) |
| *H05B 6/54* | (2006.01) |
| *H05B 6/62* | (2006.01) |

(52) U.S. Cl.
CPC .. *H01J 37/32724* (2013.01); *H01J 37/32541* (2013.01); *H01J 37/32568* (2013.01); *H05B 1/0233* (2013.01); *H05B 6/54* (2013.01); *H05B 6/62* (2013.01)

(58) Field of Classification Search
CPC ............ C23C 16/4586; H01J 37/32541; H01J 37/32568; H01J 37/32724; H05B 1/0233; H05B 3/283; H05B 6/54; H05B 6/62; H05B 2203/037
See application file for complete search history.

(56) References Cited

U.S. PATENT DOCUMENTS

| | | | |
|---|---|---|---|
| 2017/0372928 A1* | 12/2017 | Yamada | ............... H05B 1/0233 |
| 2021/0051769 A1* | 2/2021 | Endo | ................. H01L 21/67103 |
| 2022/0148859 A1 | 5/2022 | Rin et al. | |

FOREIGN PATENT DOCUMENTS

| | | |
|---|---|---|
| JP | 2017-163157 A | 9/2017 |
| JP | 2020-009795 A | 1/2020 |

\* cited by examiner

*Primary Examiner* — Benjamin Kendall
(74) *Attorney, Agent, or Firm* — XSENSUS LLP

(57) ABSTRACT

A base disposed in a plasma processing chamber. An electrostatic chuck disposed on an upper portion of the base, the electrostatic chuck including a first part and a second part. A first heater electrode layer group including at least one heater electrode layer disposed in the first part. A second heater electrode layer group including at least one heater electrode layer disposed in the second part. A power source is electrically connected to the first heater electrode layer group and the second heater electrode layer group. A controller configured to periodically and sequentially supply DC current from the power source to heater electrode layers included in the first heater electrode layer group and heater electrode layers included in the second heater electrode layer group.

12 Claims, 15 Drawing Sheets

FIG.8

| Area | CHILLER TEMPERATURE | HEATER TEMPERATURE | HEATER RESISTANCE VALUE | ON-TIME INTERVAL NEEDED FOR Δ70°C | mv | POWER-SUPPLY POSSIBLE TIME INTERVAL ΔT |
|------|------|------|------|------|------|------|
| Area1 | -45°C | +25°C (Δ70°C) | 15.00 Ω | 12.80 msec/100 msec | 64.00% | 20.0 msec |
| Area2 | | | 36.00 Ω | 24.84 msec/100 msec | 62.10% | 40.0 msec |
| Area3 | | | 44.00 Ω | 12.45 msec/100 msec | 62.25% | 20.0 msec |
| Area4 | | | 31.00 Ω | 7.52 msec/100 msec | 62.67% | 12.0 msec |

FIG.12

| Area | GROUP | POWER-SUPPLY POSSIBLE TIME INTERVAL | DELAY |
|---|---|---|---|
| Area1 | GROUP 3 | 20% | 0% |
| Area2-1 | GROUP 1 | 40% | 0% |
| Area2-2 | GROUP 1 | 40% | 40% |
| ⋮ | | | |

PLASMA PROCESSING APPARATUS AND TEMPERATURE CONTROLLING METHOD

CROSS-REFERENCE TO RELATED APPLICATIONS

The present application claims priority to and incorporates by reference the entire contents of Japanese Patent Application No. 2022-116865 filed in Japan on Jul. 22, 2022.

FIELD

Exemplary embodiment disclosed herein relates to a plasma processing apparatus and a temperature controlling method

BACKGROUND

Japanese Laid-open Patent Publication No. 2020-009795 discloses a technology in which heaters are provided to respective zones obtained by sectioning a placement surface of a substrate supporting unit for supporting a substrate, so as to enable to adjust a temperature of the placement surface for each of the zones.

The present disclosure provides a technology for reducing increase in electric power capacity of a power source that supplies electric power to heaters even in a case where the number of the heaters is increased.

SUMMARY

According to an aspect of a present disclosure, a plasma processing apparatus includes: a plasma processing chamber; a base disposed in the plasma processing chamber; an electrostatic chuck disposed on an upper portion of the base, the electrostatic chuck including a first part and a second part; a first heater electrode layer group including at least one heater electrode layer disposed in the first part; a second heater electrode layer group that includes at least one heater electrode layer arranged in the second part; a power source electrically connected to the first heater electrode layer group and the second heater electrode layer group; and a controller configured to periodically and sequentially supply DC current from the power source to heater electrode layers included in the first heater electrode layer group and heater electrode layers included in the second heater electrode layer group.

BRIEF DESCRIPTION OF DRAWINGS

FIG. 8 is a diagram illustrating examples of possible time intervals for power supply and resistance values of heaters in each of the zones according to the embodiment;

FIG. 12 is a diagram illustrating one example of power-supply controlling information according to the embodiment;

FIG. 13 is a diagram illustrating one example of temperature control according to the embodiment;

FIG. 14 is a diagram illustrating another assignment examples of respective possible time intervals for power supply to zones for each of the groups according to the embodiment; and FIG. 15 is a diagram illustrating one example of a processing order of a temperature controlling method according to the embodiment.

DESCRIPTION OF EMBODIMENTS

Exemplary embodiments of a plasma processing apparatus and a temperature controlling method disclosed in the present application will be explained below in detail with reference to the accompanying drawings. The present invention is not limited to the embodiments explained below.

In a plasma process, such as a plasma etching process and a film forming process, a processing situation changes due to the temperature of a substrate. Thus, in a plasma processing apparatus, a substrate supporting unit is used, which is capable of adjusting the temperature for each of zones obtained by sectioning a placement surface thereof. Heaters are provided to the respective zones in the above-mentioned substrate supporting unit. The plasma processing apparatus supplies electric power to a heater in each of the zones and causes the corresponding heater to generate heat, so as to control the temperature of the zones.

The plasma processing apparatus finely controls the temperature of a substrate for each region, thereby leading to an increasing tendency of the number of zones in the substrate supporting unit. However, the number of heaters increases as the number of zones increases, which causes increase in electric power capacity needed for a power source that supplies electric power to the heaters.

Therefore, there has been desired a technology that reduces increase in electric power capacity of a power source that supplies electric power to heaters even in a case where the number of the heaters is increased.

EMBODIMENT

Configuration of Apparatus

One example of a plasma processing apparatus according to the present disclosure will be explained. In an embodiment to be described below, a case will be exemplified in which a plasma processing system whose system configuration is that of a plasma processing apparatus according to the present disclosure.

Figure 1:
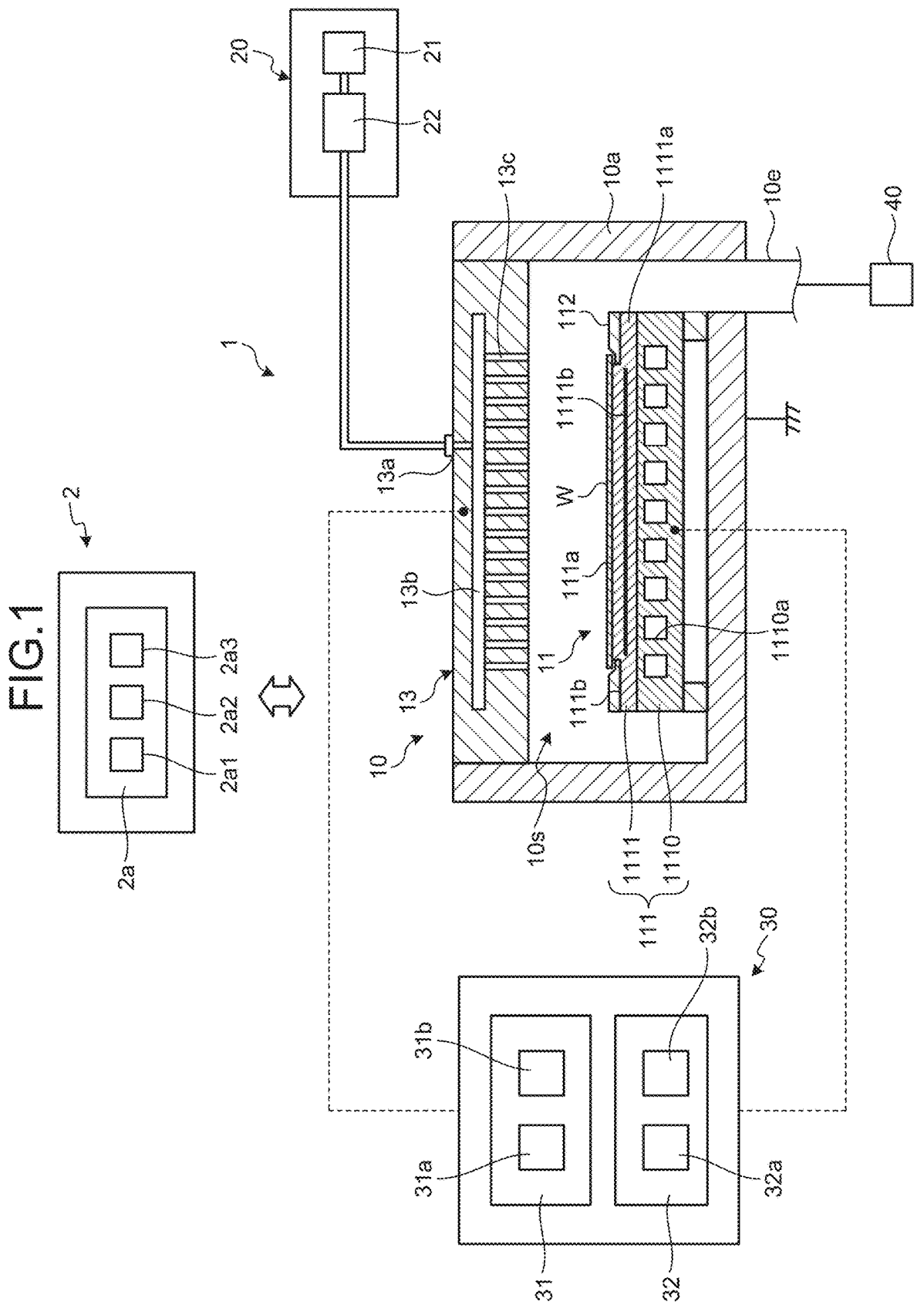
FIG. 1 is a diagram illustrating a configuration example of a plasma processing apparatus according to an embodiment, which has a capacity-coupling type.

Hereinafter, a configuration example of the plasma processing system will be explained. FIG. 1 is a diagram illustrating a configuration example of the plasma process-
ing system according to an embodiment, which has a capac-
ity-coupling type.

The plasma processing system includes a plasma process-
ing apparatus 1 having a capacity-coupling type, and a
controller 2. The plasma processing apparatus 1 having a
capacity-coupling type includes a plasma processing cham-
ber 10, a gas supplying unit 20, a power source 30, and an
exhaust system 40. The plasma processing apparatus 1
further includes a substrate supporting unit 11 and a gas
introducing unit. The gas introducing unit is configured to
lead at least one process gas into the plasma processing
chamber 10. The gas introducing unit includes a showerhead
13. The substrate supporting unit 11 disposed in the plasma
processing chamber 10. The showerhead 13 disposed above
the substrate supporting unit 11. In one embodiment, the
showerhead 13 forms at least a part of a ceiling of the plasma
processing chamber 10. The plasma processing chamber 10
includes a plasma processing space 10s that is formed by the
showerhead 13, a side wall 10a of the plasma processing
chamber 10, and the substrate supporting unit 11. The
plasma processing chamber 10 includes at least one gas
supplying port for supplying at least one process gas to the
plasma processing space 10s, and at least one gas discharg-
ing port for discharging gas from the plasma processing
space. The plasma processing chamber 10 is grounded. The
showerhead 13 and the substrate supporting unit 11 are
electrically insulated from a housing of the plasma process-
ing chamber 10.

The substrate supporting unit 11 includes a body part 111
and a ring assembly 112. The body part 111 includes a center
region 11a for supporting a substrate W, and a ring-shaped
region 111b for supporting the ring assembly 112. A wafer
is one example of the substrate W. The ring-shaped region
111b of the body part 111 surrounds the center region 11a
of the body part 111 in a plan view. The substrate W is
arranged on the center region 11a of the body part 111, and
the ring assembly 112 is arranged on the ring-shaped region
111b of the body part 111 so as to surround the substrate W
that is arranged on the center region 11a of the body part
111. Thus, the center region 11a is also referred to as a
substrate supporting surface for supporting the substrate W,
and the ring-shaped region 111b is also referred to as a ring
supporting surface for supporting the ring assembly 112.

In one embodiment, the body part 111 includes a base
1110 and an electrostatic chuck 1111. The base 1110 includes
an electric conductive member. The electric conductive
member of the base 1110 may function as a lower electrode.
The electrostatic chuck 1111 is arranged on the base 1110.
The electrostatic chuck 1111 includes a ceramic member
1111a and an electrostatic electrode 1111b that is arranged in
the ceramic member 1111a. The ceramic member 1111a
includes the center region 11a. In one embodiment, the
ceramic member 1111a further includes the ring-shaped
region 111b. Another member that surrounds the electro-
static chuck 1111, such as the ring-shaped electrostatic
chuck and the ring-shaped insulation member, may include
the ring-shaped region 111b. In this case, the ring assembly
112 may be arranged on the ring-shaped electrostatic chuck
or the ring-shaped insulation member, or may be arranged on
both of the electrostatic chuck 1111 and the ring-shaped
insulation member. Furthermore, at least one of Radio-
Frequency/Direct Current (RF/DC) electrodes connected to
an RF power source 31 and/or a DC power source 32 that are
to be mentioned later may be arranged in the ceramic
member 1111a. In this case, at least one of RF/DC electrodes
functions as a lower electrode. In a case where a bias RF signal and/or a DC signal to be mentioned later is supplied
to at least one of RF/DC electrodes, the RF/DC electrodes
may be referred to as bias electrodes. Note that an electric
conductive member of the base 1110 and at least one of
RF/DC electrodes may function as a plurality of lower
electrodes. Moreover, the electrostatic electrode 1111b may
function as a lower electrode. Thus, the substrate supporting
unit 11 includes at least one lower electrode.

The ring assembly 112 includes at least one ring-shaped
member. In one embodiment, the at least one ring-shaped
member includes at least one edge ring and at least one cover
ring. The edge ring is formed of an electric conductive
material or an insulation material, and the cover ring is
formed of an insulation material.

The substrate supporting unit 11 may include a tempera-
ture controlling module that is configured to adjust at least
one of the electrostatic chuck 1111, the ring assembly 112,
and a substrate to a target temperature. The temperature
controlling module may include a heater, a heat transfer
medium, a flow path 1110a, or a combination thereof. A heat
transfer fluid such as brine and gas flows through the flow
path 1110a. In one embodiment, the flow path 1110a is
formed in the base 1110, at least one heater is arranged in the
ceramic member 1111a of the electrostatic chuck 1111. The
substrate supporting unit 11 may include a heat transfer gas
supplying unit that is configured to supply heat transfer gas
into a gap between a back surface of the substrate W and the
center region 111a.

The showerhead 13 is configured to lead at least one
process gas supplied from the gas supplying unit 20 into the
plasma processing space 10s. The showerhead 13 includes at
least one gas supplying port 13a, at least one gas diffusion
chamber 13b, and a plurality of gas introducing ports 13c.
The process gas supplied to the gas supplying port 13a
passes through the gas diffusion chamber 13b to be led into
the plasma processing space 10s from the plurality of gas
introducing ports 13c. The showerhead 13 includes at least
one upper electrode. The gas introducing unit may include,
in addition to the showerhead 13, at least one Side Gas
Injector (SGI) that is attached to at least one opening formed
on the side wall 10a.

the gas supplying unit 20 may include at least one gas
source 21 and at least one flow-volume controller 22. In
one embodiment, the gas supplying unit 20 is config-
ured to individually supply, to the showerhead 13, at
least one process gas from the corresponding gas
source 21 through the corresponding flow-volume con-
troller 22. Each of the flow-volume controllers 22 may
include a mass flow controller or a flow-volume con-
troller having a pressure controlling type, for example.
Moreover, the gas supplying unit 20 may include at
least one flow-volume modulating apparatus that
modulates or pulses a flow volume of at least one
process gas.

The power source 30 includes the RF power source 31
that is connected to the plasma processing chamber 10 via at
least one impedance matching circuit. The RF power source
31 is configured to supply at least one RF signal (RF electric
power) to at least one lower electrode and/or at least one
upper electrode. Thus, plasma is formed from at least one
process gas that is supplied to the plasma processing space
10s. Thus, the RF power source 31 may function as at least
a part of a plasma generating unit that is configured to
generate, in the plasma processing chamber 10, plasma from
at least one process gas. In a case where a bias RF signal is
supplied to at least one lower electrode, a bias voltage is generated in the substrate W to be able to draw ion components in the formed plasma toward the substrate W.

In one embodiment, the RF power source 31 includes a first RF generating unit 31a and a second RF generating unit 31b. The first RF generating unit 31a is configured to be connected to at least one lower electrode and/or at least one upper electrode via at least one impedance matching circuit so as to generate a source RF signal (source RF electric power) for generating plasma. In one embodiment, a source RF signal has a frequency within a range of 10 MHz to 150 MHz. In one embodiment, the first RF generating unit 31a may be configured to generate a plurality of source RF signals having different frequencies. The generated at least one source RF signal is supplied to the at least one lower electrode and/or the at least one upper electrode.

The second RF generating unit 31b is configured to be connected to at least one lower electrode via at least one impedance matching circuit so as to generate a bias RF signal (bias RF electric power). A frequency of the bias RF signal may be equal to or not equal to a frequency of the source RF signal. In one embodiment, a bias RF signal includes a frequency that is lower than a frequency of a source RF signal. In one embodiment, a bias RF signal includes a frequency that is within a range of 100 kHz to 60 MHz. In one embodiment, the second RF generating unit 31b may be configured to generate a plurality of bias RF signals having different frequencies. The generated at least one bias RF signal is supplied to at least one lower electrode. Moreover, in various embodiments, at least one of a source RF signal and a bias RF signal may be pulsed.

The power source 30 may include the DC power source 32 that is connected to the plasma processing chamber 10. The DC power source 32 includes a first DC generating unit 32a and a second DC generating unit 32b. In one embodiment, the first DC generating unit 32a is configured to be connected to at least one lower electrode so as to generate a first DC signal. The generated first bias DC signal is applied to at least one lower electrode. In one embodiment, the second DC generating unit 32b is configured to be connected to at least one upper electrode so as to generate a second DC signal. The generated second DC signal is applied to at least one upper electrode.

In various embodiments, at least one of first and second DC signals may be pulsed. In this case, a sequence of voltage pulses is applied to at least one lower electrode and/or at least one upper electrode. The voltage pulse may have a pulse waveform of a rectangle, a trapezium, a triangle, or a combination thereof. In one embodiment, a waveform generating unit that generates a sequence of voltage pulses from a DC signal is connected between the first DC generating unit 32a and at least one lower electrode. Thus, the first DC generating unit 32a and the waveform generating unit constitutes the voltage-pulse generating unit. In a case where the second DC generating unit 32b and the waveform generating unit constitute the voltage-pulse generating unit, the voltage-pulse generating unit is connected to at least one upper electrode. The voltage pulse may have a positive polarity, or may have a negative polarity. The sequence of voltage pulses may include at least one positive-polarity voltage pulse and at least one negative-polarity voltage pulse during a single period. The first and the second DC generating units 32a and 32b may be provided in addition to the RF power source 31, or the first DC generating unit 32a may be provided instead of the second RF generating unit 31b.

The exhaust system 40 is connected to a gas discharging port 10e that is arranged in a bottom portion of the plasma processing chamber 10, for example. The exhaust system 40 may include a pressure adjusting valve and a vacuum pump. The pressure adjusting valve adjusts a pressure in the plasma processing space 10s. The vacuum pump may include a turbo-molecular pump, a dry pump, or a combination thereof.

The controller 2 processes commands to be executed by a computer, which cause the plasma processing apparatus 1 to execute various processes described in the present disclosure. The controller 2 is configured to control elements of the plasma processing apparatus 1 so as to execute various processes described here. In one embodiment, a part or whole of the controller 2 may be included in the plasma processing apparatus 1. The controller 2 may include a processing unit 2a1, a storage 2a2, and a communication interface 2a3. The controller 2 is realized by a computer 2a, for example. The processing unit 2a1 is configured to read out a program from the storage 2a2 and further to execute the read program so as to execute various control operations. The program may be preliminarily stored in the storage 2a2, or may be acquired via a medium as needed. The acquired program is stored in the storage 2a2, is read out from the storage 2a2 by the processing unit 2a1, and is executed. The medium may be various storage media that can be read by the computer 2a, or may be a communication network that is connected to the communication interface 2a3. The processing unit 2a1 may be a Central Processing Unit (CPU). The storage 2a2 may include a Random Access Memory (RAM), a Read Only Memory (ROM), a Hard Disk Drive (HDD), a Solid State Drive (SSD), or a combination thereof. The communication interface 2a3 may communicate with the plasma processing apparatus 1 via a communication network such as a Local Area Network (LAN).

Figure 2:
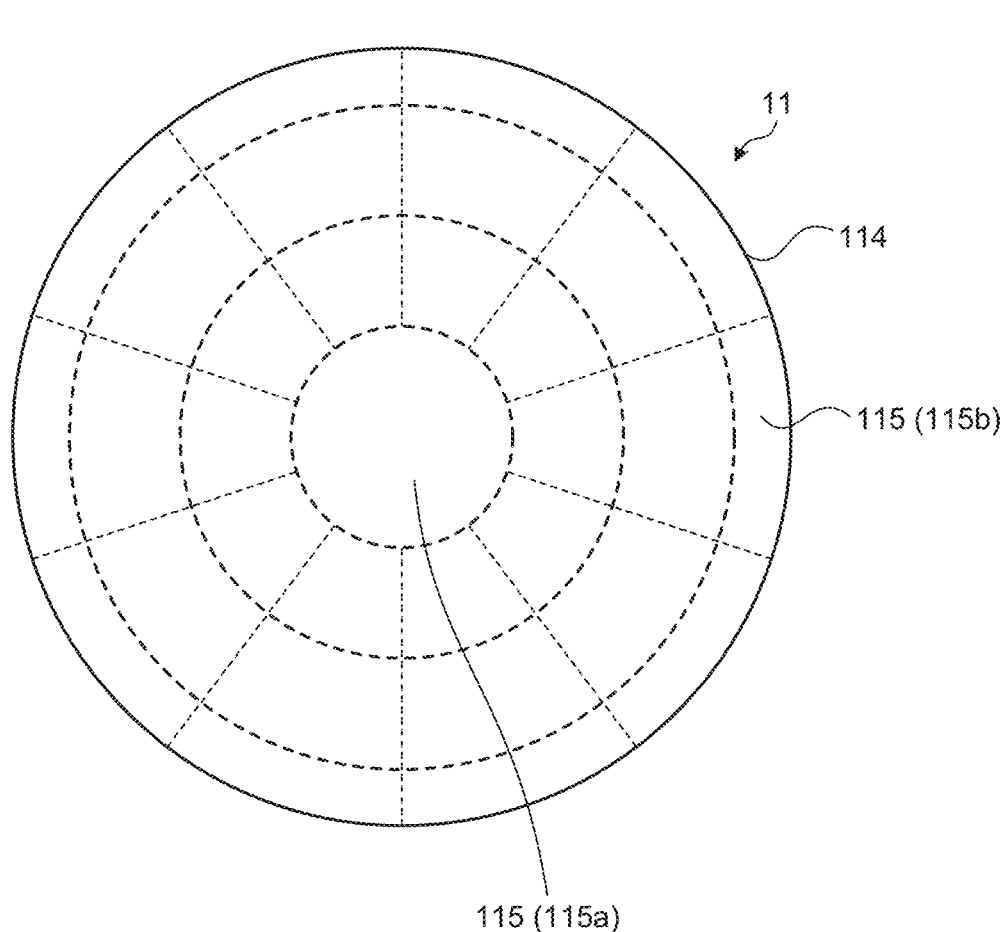
FIG. 2 is a diagram illustrating a configuration example of a substrate supporting unit according to the embodiment.

Next, a configuration of the substrate supporting unit 11 according to the embodiment will be explained. FIG. 2 is a diagram illustrating a configuration example of the substrate supporting unit 11 according to the embodiment. FIG. 2 illustrates the substrate W of the substrate supporting unit 11, and a placement surface 114 of the electrostatic chuck 1111 on which the ring assembly 112 is placed. The placement surface 114 corresponds to the center region 111a and the ring-shaped region 111b illustrated in FIG. 1.

In the example illustrated in FIG. 2, the placement surface 114 is substantially a circle-shaped region in a plan view.

The substrate supporting unit 11 is configured to be capable of controlling a temperature for each of zones 115 obtained by dividing the placement surface 114 of the electrostatic chuck 1111. For example, the placement surface 114 is sectioned into the plurality of zones 115, and heaters are embedded in the respective zones 115. In the embodiment, as illustrated in FIG. 2, the placement surface 114 is sectioned into a central circle-shaped zone 115a and arc-shaped zones 115b obtained by sectioning in a circumference direction a plurality of ring-shaped regions that concentrically surround the above-mentioned circle-shaped zone 115a. The zone 115b in the outermost periphery corresponds the ring-shaped region 111b on which the ring assembly 112 is placed. The circle-shaped zone 115a and the zones 115b that are inside of the outermost periphery are correspond to the center region 111a on which the substrate W placed. The sectioning method of the zones 115 illustrated in FIG. 2 is merely one example, and not limited thereto. For example, the placement surface 114 may be sectioned in a grid pattern into the zones 115. The placement surface 114 may be sectioned into the more zones 115. For example, the arc-shaped zones 115b of the placement surface 114 may be sectioned such that an angle width is smaller and a width in a radial direction is narrower as a position is closer to the outermost periphery.

The substrate supporting unit 11 is configured to be capable of measuring a temperature for each of the zones 115 of the placement surface 114. For example, in the substrate supporting unit 11, temperature sensors are provided to the respective zones 115 so as to measure a temperature for each of the zones 115.

Figure 3:
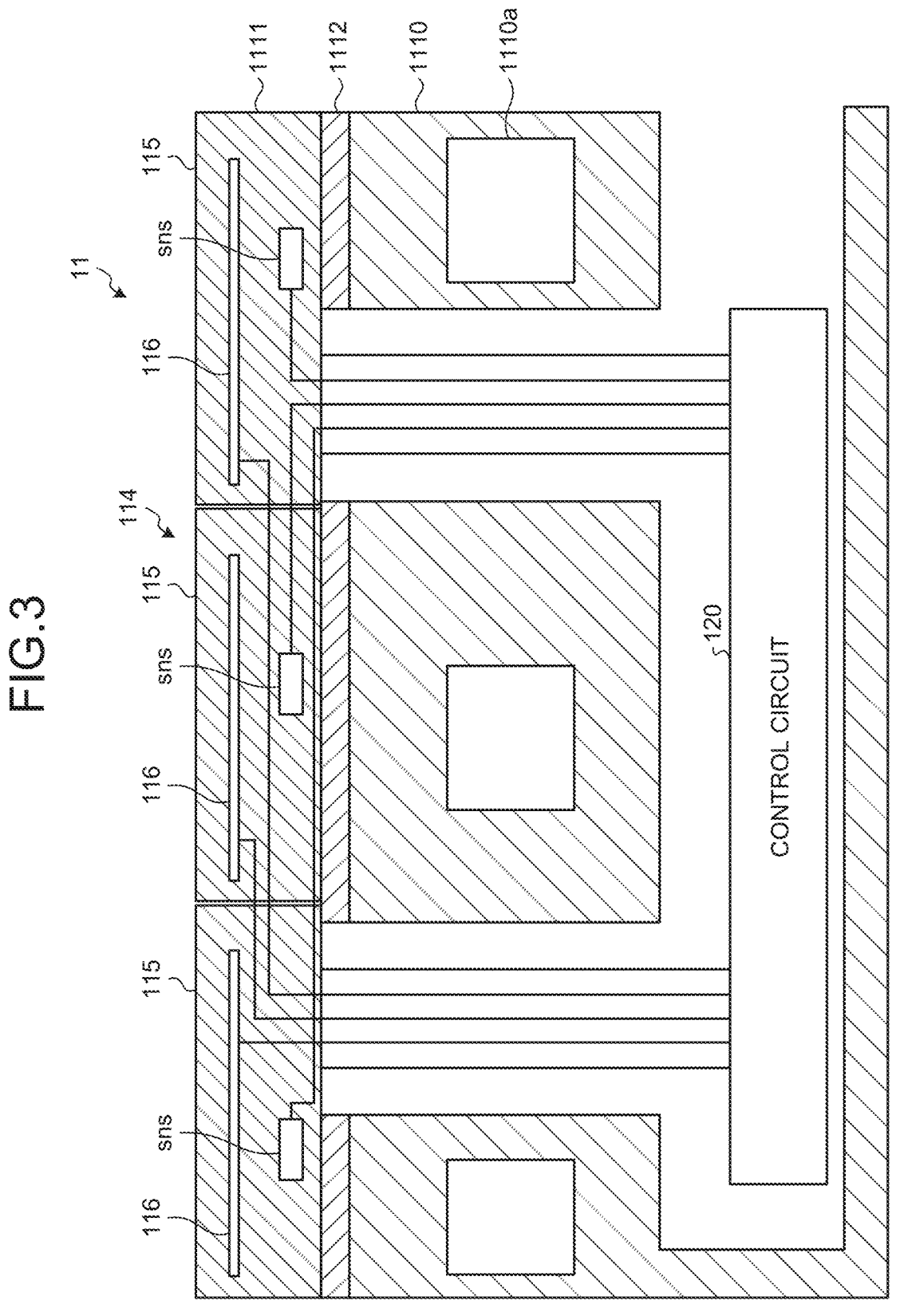
FIG. 3 is a diagram illustrating a configuration example of the substrate supporting unit according to the embodiment.

FIG. 3 is a diagram illustrating a configuration example of the substrate supporting unit 11 according to the embodiment. In FIG. 3, a cross-sectional view of the substrate supporting unit 11 is illustrated.

The substrate supporting unit 11 is configured to be capable of supporting the substrate W. For example, in the body part 111 of the substrate supporting unit 11, the electrostatic chuck 1111 disposed on the base 1110. The electrostatic chuck 1111 is bonded to the base 1110 by using a bonding layer 1112. An upper surface of the electrostatic chuck 1111 is the placement surface 114.

The base 1110 includes an electric conductive member. For example, the base 1110 is formed of an electric conductive metal such as aluminum.

The electrostatic chuck 1111 includes an insulation layer such as a ceramic, and a film-shaped electrode that is provided in the above-mentioned insulation layer. Direct current is applied from a not-illustrated power source to the electrode provided in the inner part so that the electrostatic chuck 1111 generates electrostatic attraction, and further attracts and holds the substrate W.

In the base 1110, the flow paths 1110*a* through which heat transfer fluid flows are formed in an inner part under the placement surface 114. In the electrostatic chuck 1111, heaters 116 are provided to the respective zones 115. The heater 116 is an electrode layer that is provided in the electrostatic chuck 1111. The heater 116 corresponds to a heater electrode layer according to the present disclosure. Temperature-controlled heat transfer fluid flows through the flow path 1110*a*, and thus temperature adjustment can be performed on whole of the substrate supporting unit 11, and further each of the heaters 116 is heated so as to individually perform temperature adjustment on each of the zones 115.

In the electrostatic chuck 1111, temperature sensors sns are provided to the respective zones 115. The temperature sensor sns may be provided in the base 1110 or in the bonding layer 1112. A control circuit 120 disposed in a lower portion of the base 1110. The heaters 116 are connected to the control circuit 120. The control circuit 120 controls electric power to be supplied to the heater 116, so as to be capable of controlling the temperature of the heater 116.

The temperature sensors sns are connected to the control circuit 120. The control circuit 120 measures the temperature of each of the zones 115 by using the corresponding temperature sensor sns. The control circuit 120 outputs data on the measured temperature of the zones 115 to the controller 2. The control circuit 120 supplies electric power that is individually adjusted for each of the heaters 116 under the control executed by the controller 2.

Incidentally, the plasma processing apparatus 1 finely controls the temperature of the substrate W for each zone, and thus has an increasing tendency of the number of the zones 115 in the placement surface 114 of the substrate supporting unit 11. However, the number of the heaters 116 increases as the number of the zones 115 increases, so that electric power capacity accordingly increases, which is needed for a power source that supplies electric power to the heater 116.

Figure 4:
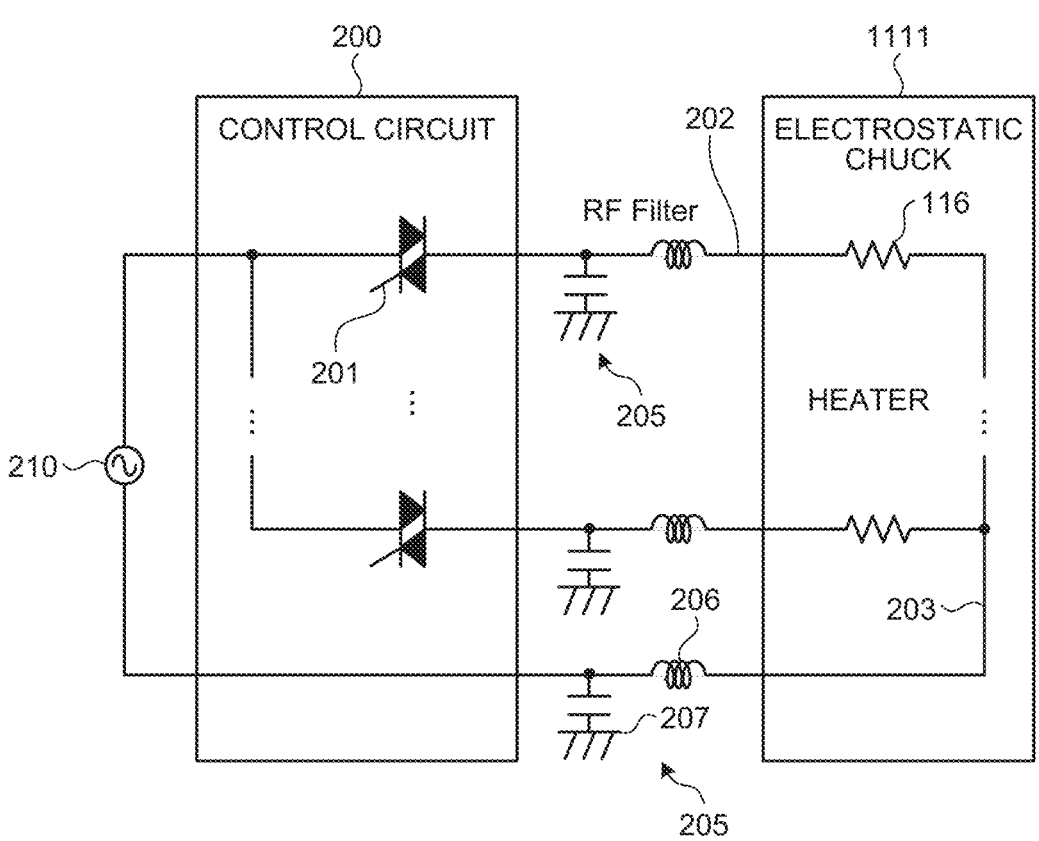
FIG. 4 is a diagram schematically illustrating a configuration example of a conventional power supply system.

Herein, as a comparison example, a configuration example of a conventional power supply system that supplies electric power to the heater 116 will be explained. FIG. 4 is a diagram schematically illustrating a configuration example of a conventional power supply system. The electrostatic chuck 1111, a control circuit 200, and an AC power source 210 are illustrated in FIG. 4.

The plurality of heaters 116 is provided to the electrostatic chuck 1111. The heater 116 is illustrated as a heater resistance that generates heat when current flows through the heater resistance. The heaters 116 are arranged in the respective zones 115 of the placement surface 114.

Triacs 201 as switches are provided to the control circuit 200, which correspond to the respective heaters 116. One end of each of the heaters 116 is connected to the corresponding triac 201 via a corresponding wire 202, and other ends of the heaters 116 are connected to a common line 203 in parallel. The triacs 201 are connected in parallel to one end of the AC power source 210. The common line 203 is connected to another end of the AC power source 210.

In the plasma processing apparatus 1, in a case where plasma is generated in the plasma processing space 10*s*, high-frequency noise propagates to the heaters 116, the wires 202, and the common line 203. RF filters 205 for cutting high-frequency noise are provided to the respective wires 202 and the common line 203. A resistance 206 and a capacitor 207 that constitute the RF filter 205 is provided to each of the wires 202 and the common line 203. The RF filter 205 is provided to each of the wires 202 and the common line 203 as described above, and thus it is possible to protect the control circuit 200 and the AC power source 210 from high-frequency noise.

Under the control executed by the controller 2, the control circuit 200 turns ON/OF each of the triacs 201 so as to control electric power to be supplied, and further controls the temperature of the corresponding heater 116.

However, in the configuration of the conventional power supply system illustrated in FIG. 4, the RF filters 205 are provided to the respective wires 202 and the common line 203, and thus the number of the RF filters 205 is larger as the number of the zones 115 is larger, so that a size of a portion including the RF filters 205 becomes large.

Figure 5:
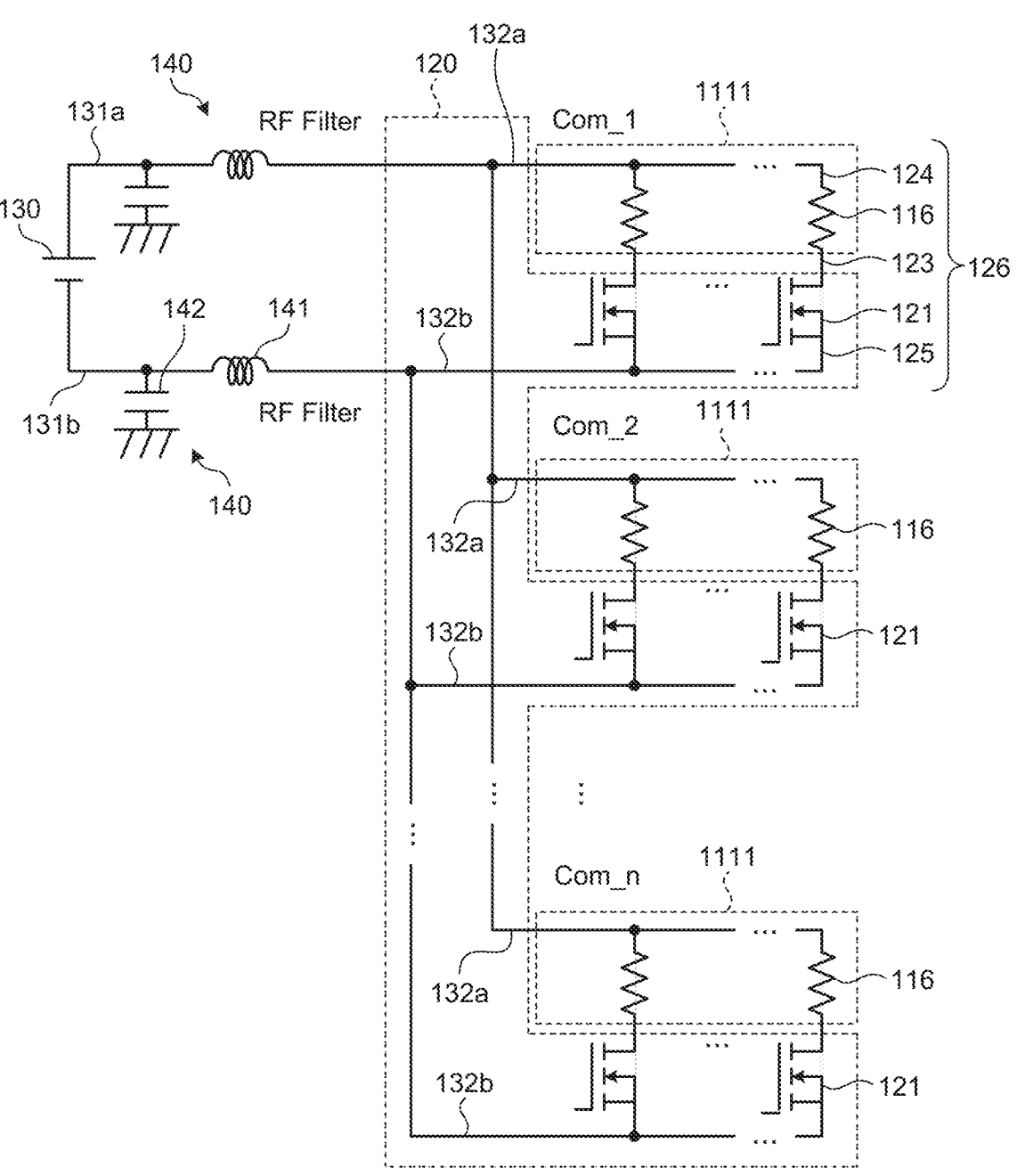
FIG. 5 is a diagram schematically illustrating a configuration example of a power supply system according to the embodiment.

Therefore, in the present embodiment, a power supply system that supplies electric power to the heaters 116 is configured as described below. FIG. 5 is a diagram schematically illustrating a configuration example of a power supply system according to the embodiment. The electrostatic chuck 1111, the control circuit 120, and a power source 130 are illustrated in FIG. 5. Note that in FIG. 5, for convenience of explanation of a circuit configuration in the power supply system, the electrostatic chuck 1111 is indicated while dividing it into a plurality of parts. The power source 130 is configured as a DC power source. For example, the power source 130 is constituted of an AC power source that supplies AC electric power and an AC/DC converter that converts AC electric power into DC. The power source 130 corresponds to a power source according to the present disclosure.

In the electrostatic chuck 1111, the heaters 116 are provided to the respective zones 115 on the placement surface 114. In the control circuit 120, switches 121 are provided which correspond to the respective heaters 116. In the example illustrated in FIG. 5, a metal-oxide-semiconductor field effect transistor (MOSFET) is indicated as the switch 121. Note that the switch 121 may be, not limited to a MOSFET, a semiconductor switch having another type.

Main power-supply lines 131$a$ and 131$b$ are connected to the power source 130. RF filters 140 are respectively provided to the main power-supply lines 131$a$ and 131$b$ for cutting high-frequency noise. A resistance 141 and a capacitor 142 constituting the RF filter 140 are provided to each of the main power-supply lines 131$a$ and 131$b$. To the main power-supply lines 131$a$ and 131$b$, $n$-power supply lines 132$a$ and $n$-power supply lines 132$b$ (Com 1 to Com n) are connected in parallel. The main power-supply lines 131$a$ and 131$b$ correspond to a main power-supply line according to the present disclosure. The power supply lines 132$a$ and 132$b$ respectively correspond to a first power supply line and a second power supply line according to the present disclosure.

In each of the heaters 116, one end of the corresponding heater 116 is connected to the corresponding switch 121 via a corresponding wire 123, and another end of the corresponding heater 116 is connected to the corresponding power supply line 132$a$ via a corresponding wire 124. The switches 121 are connected to the respective power supply lines 132$b$ via wires 125.

To the power supply lines 132$a$ and 132$b$, a plurality of series circuits 126 is connected in parallel, each of which is constituted of the wire 124, the heater 116, the wire 123, the switch 121, and the wire 125. In the present embodiment, each of the zones 115 of the placement surface 114 is divided into a plurality of groups. For each of the groups, the heaters 116 and the switches 121 of the zones 115 included in the corresponding group are connected in parallel to the same power supply lines 132$a$ and 132$b$.

Figure 6:
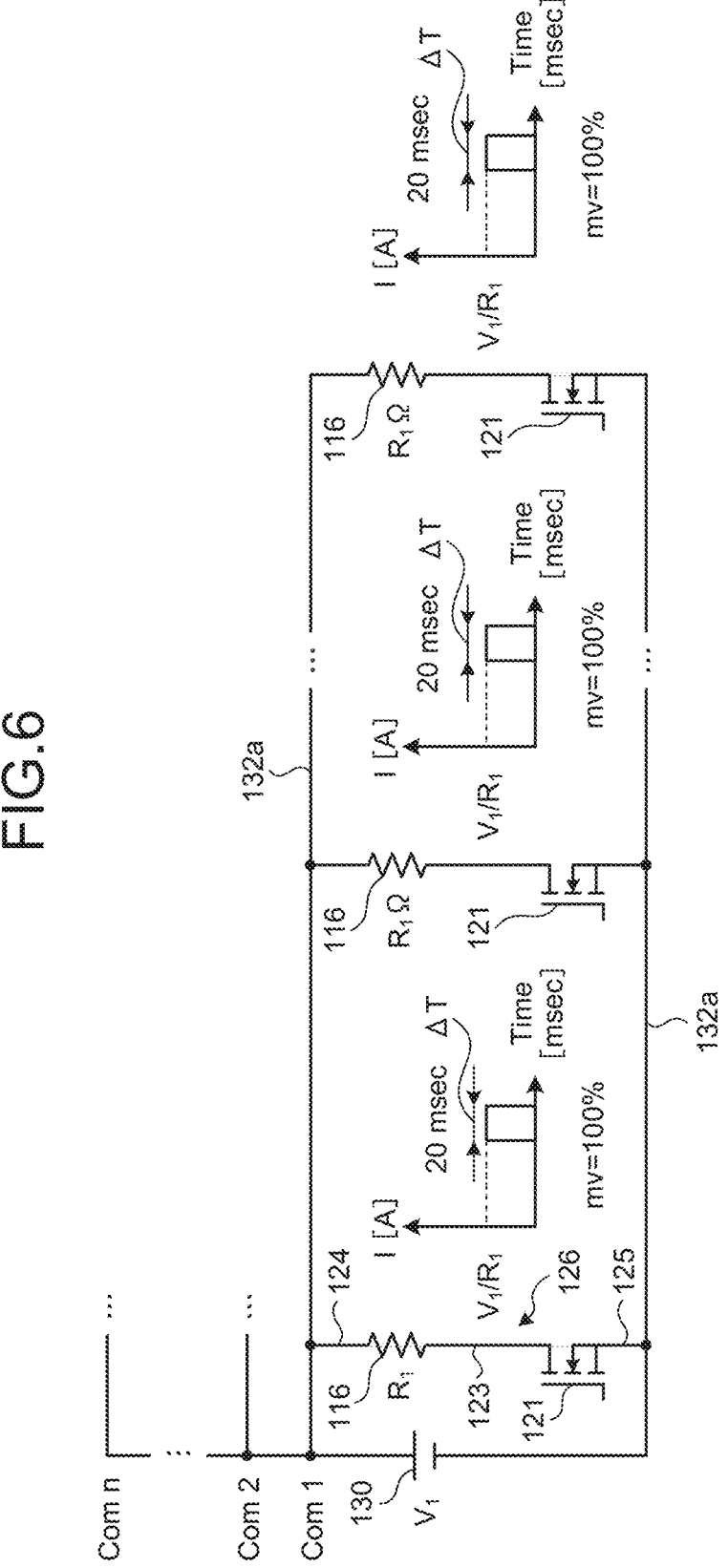
FIG. 6 is a diagram illustrating one example of power supplying to heaters according to the embodiment.

In a configuration of the power supply system according to the embodiment, for each pair of the power supply lines 132$a$ and 132$b$, the switches 121 connected to the corresponding power supply lines 132$a$ and 132$b$ are periodically and sequentially turned on so as to supply electric power to the heaters 116 by time division. FIG. 6 is a diagram illustrating one example of power supplying to the heaters 116 according to the embodiment. In FIG. 6, there are illustrated the heaters 116 and the switches 121 that are connected to one pair of the power supply lines 132$a$ and 132$b$ (Com 1).

Circuit 120 periodically and sequentially turns on the switches 121 so as to supply electric power to the heaters 116 by time division. Electric power is periodically supplied to the heaters 116 of each of the zones 115 so as to generate heat. In FIG. 6, the switches 121 connected to the power supply lines 132$a$ and 132$b$ are periodically turned on by time division.

In a case where electric power is supplied by time division, a possible time interval $\Delta T$ for power supply in a single period is decided, during which electric power can be supplied to the heater 116. In FIG. 6, the possible time interval $\Delta T$ of each of the heaters 116 during a single period is set to 20 (msec).

During the possible time interval $\Delta T$, the control circuit 120 turns the switch 121 into an ON-state so as to supply electric power. Assume that a ratio of a power supplying time interval during which the switch 121 is turned into an ON-state to supply electric power to the possible time interval $\Delta T$ is an operation amount mv. Under the control executed by the controller 2, the control circuit 120 controls the operation amount my so as to control the temperature of the heater 116. In FIG. 6, for example, in a case where the operation amount my=1001, the control circuit 120 turns the switch 121 into an ON-state for 20 (msec) during the possible time interval $\Delta T$ of 20 (msec). Assume that in a case where a DC voltage of the power source 130 is $V_1$ [V] and a resistance of the heater 116 is $R_1$ [$\Omega$], when the switch 121 is turned on, an electric current of $V_1/R_1$ [A] flows through the heater 116, for example. In a case where $V_1$ is 200 [V] and $R_1$ is 50 [$\Omega$], an electric current of 4 [A] flows through the heater 116, for example.

For example, in a case where the switches 121 are simultaneously turned on without time division, electric currents flowing through the series circuits 126 concentrate in the power supply lines 132$a$ and 132$b$, so that a flowing current value becomes large. For example, in a case where the n-series circuits 126 are connected in parallel to the power supply lines 132$a$ and 132$b$, an electric current of $(V_1/R_1) \times n$ [A] flows through the power supply lines 132$a$ and 132$b$.

On the other hand, in the present embodiment, the switches 121 are periodically and sequentially turned on so as to supply electric power to the heaters 116 by time division, so that it is possible to restrict electric current flowing through the power supply lines 132$a$ and 132$b$ to small one. For example, in a case where the switches 121 are periodically turned on by time division without overlapping the possible time interval $\Delta T$, it is possible to restrict an electric current flowing through the power supply lines 132$a$ and 132$b$ to $V_1/R_1$ [A]. In a case where an electric current flowing through the single series circuit 126 is 4 [A], it is possible to restrict an electric current flowing through the power supply lines 132$a$ and 132$b$ up to 4 [A].

Furthermore, in the present embodiment, the power source 130 is configured to be capable of applying a DC voltage having a high voltage. For example, the power source 130 applies a DC voltage of 200 [V] to the main power-supply lines 131$a$ and 131$b$.

Herein, assume that electric power needed for each of the heaters 116 in heating the substrate W up to a processing temperature is at most 10 kW. In a case where the power source 130 has a low voltage (for example, 48 [V]), the power source 130 needs to increase a flowing electric current in supplying electric power needed for each of the heaters 116. In this case, a rated current of the RF filter 140 increases so that a wire becomes thick. In a case where a wire is thick, in the RF filter 140, a wiring length having the number of turns for obtaining a needed impedance increases. In a case where the wiring length increases, a direct-current resistance value of the RF filter 140 increases. In a case where the direct-current resistance value of the RF filter 140 increases, electric power converted into heat in the RF filter 140 increases, so that sufficient electric power cannot be applied to the heaters 116.

Electric power needed for each of the heaters 116 does not change even in a case where a voltage of the power source 130 is set to high. Thus, in a case where a voltage of the power source 130 is set to high, electric current flowing in supplying needed electric power to the heaters 116 from the power source 130 reduces. Thus, a rated current of the RF filter 140 can be reduced, so that it is possible to make a wire thin. In a case where a wire is thin, in the RF filter 140, a wiring length for obtaining the needed number of turns is reduced. In a case where a wiring length in the RF filter 140 is reduced, it is possible to reduce a wiring resistance. In a case where a direct-current resistance value of the RF filter 140 is reduced, electric power converted into heat in the RF filter 140 is reduced, so that it is possible to apply sufficient electric power to the heaters 116.

Figure 7:
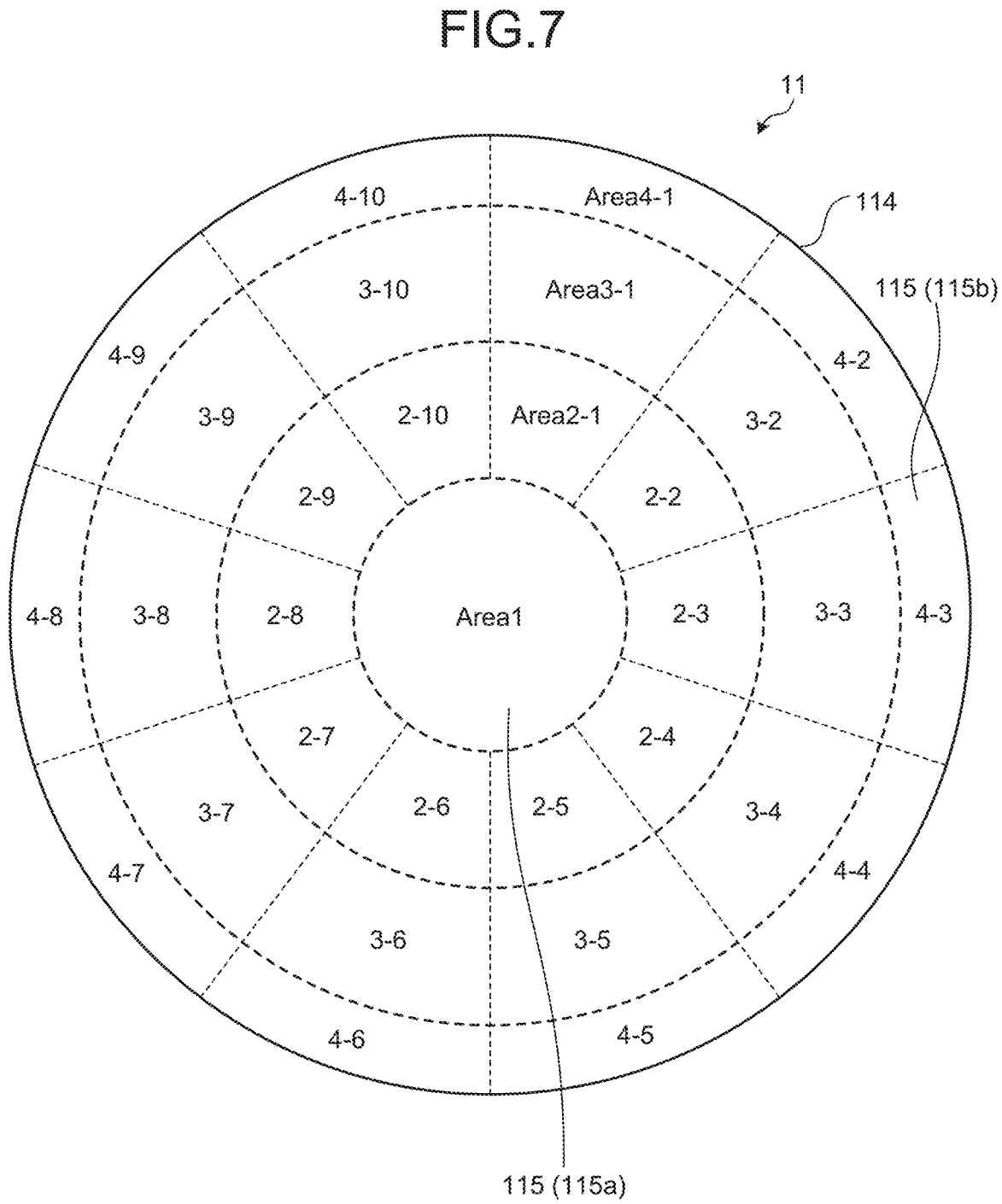
FIG. 7 is a diagram illustrating a group of each of zones of a placement surface according to the embodiment.

Next, one example of grouping performed on the zones 115 of the placement surface 114 will be explained. FIG. 7 is a diagram illustrating a group of each of the zones 115 of the placement surface 114 according to the embodiment. In FIG. 7, there are illustrated the zones 115 of the placement surface 114 in the substrate supporting unit 11.

In the present embodiment, the circle-shaped zone 115a arranged in the center of the placement surface 114 is referred to as an area 1 (Area 1). In the embodiment, ring-shaped regions are sequentially referred to as areas 2 to 4 from the circle-shaped zone 115a of the placement surface 114. In the embodiment, for each of the areas 2 to 4, branch numbers are provided to the corresponding arc-shaped zones 115b constituting corresponding one of the areas 2 to 4. For example, the zones 115b included in the area 2 are referred to as areas 2-1 to 2-10. The zones 115b included in the area 3 are referred to as areas 3-1 to 3-10. The zones 115b included in the area 4 are referred to as areas 4-1 to 4-10.

As described above, in the present embodiment, electric power is individually supplied to the heaters 116 in the zones 115 by time division. Electric power is periodically supplied to the heaters 116 of each of the zones 115 so as to generate heat. A period of time division, and the possible time interval ΔT and resistance values of the heaters 116 in each of the zones 115 are determined to be able to adjust the temperature of each of the zones 115 to a target temperature.

FIG. 8 is a diagram illustrating examples of the possible time intervals ΔT and resistance values of the heaters 116 in each of the zones 115 according to the embodiment. In FIG. 8, for example, there is illustrated temperature-controlling in which a temperature of a heat transfer fluid flowing into the flow path 1110a is set to −45° C., and a temperature is raised by 70° C. (Δ70° C.) by using the heaters 116 in each of the zones 115 of the areas 1 to 4, up to 25° C. In FIG. 8, there are indicated heater resistance values of the heaters 116 provided to the zones 115 included in the above-mentioned areas 1 to 4, ON-time intervals needed for a temperature raise by 70° C. in a case where a single period is 100 (msec), the operation amounts mv, and the possible time intervals ΔT.

In consideration of desired rise in temperature with the use of the heaters 116, electric powers needed for the heaters 116 in each of the zones 115 are decided. Thus, in a case where electric power is periodically supplied to each of the zones 115, an ON-time interval (power supplying time interval) needed per a single period is decided. Areas of the zones 115 are different between the areas 1 to 4, and thus needed electric powers are different between the areas 1 to 4. On the other hand, in a case where the areas 1 to 4 are controlled with the same rise in temperature, it is preferable that the operation amounts my are similar with respect to all of the zones 115 in the areas 1 to 4.

Thus, in each of the zones 115, a heater resistance value and the possible time interval ΔT are decided such that in a case where electric power is supplied for a power supplying time interval corresponding to a ratio of the corresponding possible time interval ΔT, a comparable rise in temperature is obtained. In the present embodiment, heater resistance values and the possible time intervals ΔT of the heaters 116 in each of the zones 115 are decided such that a temperature raise by 70° C. is obtained in a case where the operation amounts my are set to comparable values of 62% to 64%. For example, in the area 1, a heater resistance value of the heater 116 is 15 [Ω], the possible time interval ΔT is 20 (msec), and the operation amount my is 64'. Thus, in the area 1, 12.80 (msec) per a single period (100 (msec)) is a power supplying time interval. In the area 1, a heater resistance value of the heater 116 is 36 [Ω], the possible time interval ΔT is 40 (msec), and the operation amount my 62.1%. Thus, in the area 2, a power supplying time interval is 24.84 (msec) per a single period (100 (msec)). In the area 3, a heater resistance value of the heater 116 is 44 [Ω], the possible time interval ΔT is 20 (msec), and the operation amount my is 62.25%. Thus, in the area 3, 12.45 (msec) per a single period (100 (msec)) is a power supplying time interval. In the area 4, a heater resistance value of the heater 116 is 31 [Ω], the possible time interval ΔT is 12 (msec), and the operation amount my is 62.67%. Thus, in the area 4, 7.52 (msec) per a single period (100 (msec)) is a power supplying time interval.

Figure 9:
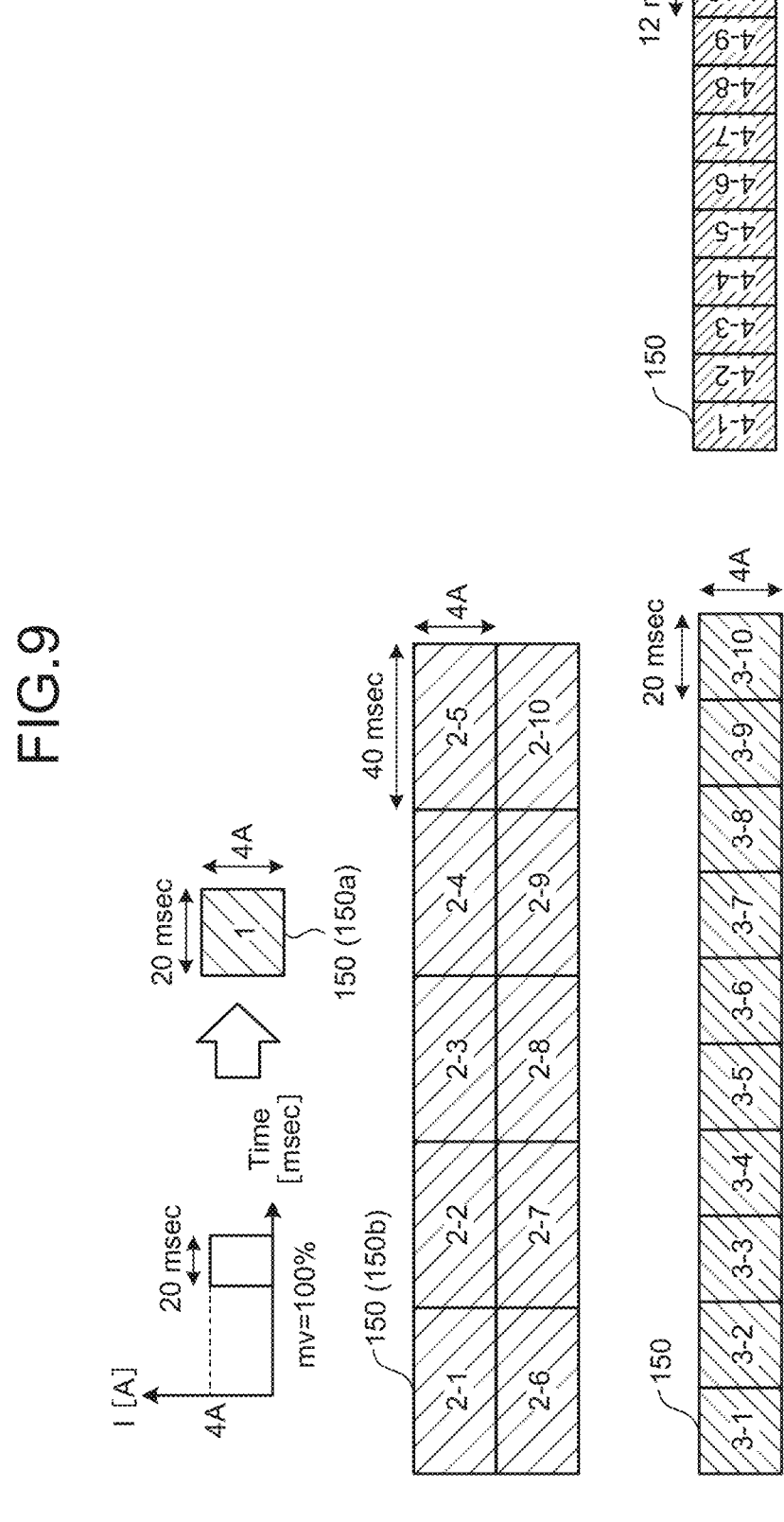
FIG. 9 is a diagram illustrating examples of possible time intervals $\Delta T$ for power supply and current values of heaters in each of the zones according to the embodiment.

FIG. 9 is a diagram illustrating examples of possible time intervals ΔT for power supply and current values of the heaters 116 in each of the zones 115 according to the embodiment. In FIG. 9, the areas 1, 2-1 to 2-10, 3-1 to 3-10, and 4-1 to 4-10 are illustrated by using quadrangular blocks 150. A horizontal length of the block 150 indicates the possible time interval ΔT for power supply of the heater 116. In the area 1, the possible time interval ΔT is 20 (msec). In the areas 2-1 to 2-10, the possible time interval ΔT is 40 (msec). In the areas 3-1 to 3-10, the possible time interval ΔT is 40 (msec). In the areas 4-1 to 4-10, the possible time interval ΔT is 12 (msec).

A vertical length of the block 150 indicates an electric current following through the heater 116 under an ON-state of the switch 121. In FIG. 9, electric currents flowing through the heaters 116 in the areas 1, 2-1 to 2-10, 3-1 to 3-10, and 4-1 to 4-10 are simplified as 4 [A].

In FIG. 9, for example, the area 1 is indicated by using a block 150a whose horizontal side is 20 (msec) and whose vertical side is 4 [A]. The area 2-1 is indicated by using a block 150b whose horizontal side is 40 (msec) and whose vertical side is 4 [A].

In the embodiment, in order to restrict the maximum electric current supplied from the power source 130 to small one, the zones 115 are divided into groups, and a timing of the possible time interval ΔT of each of the zones 115 during a single period is assigned to each of the groups.

Figure 10:
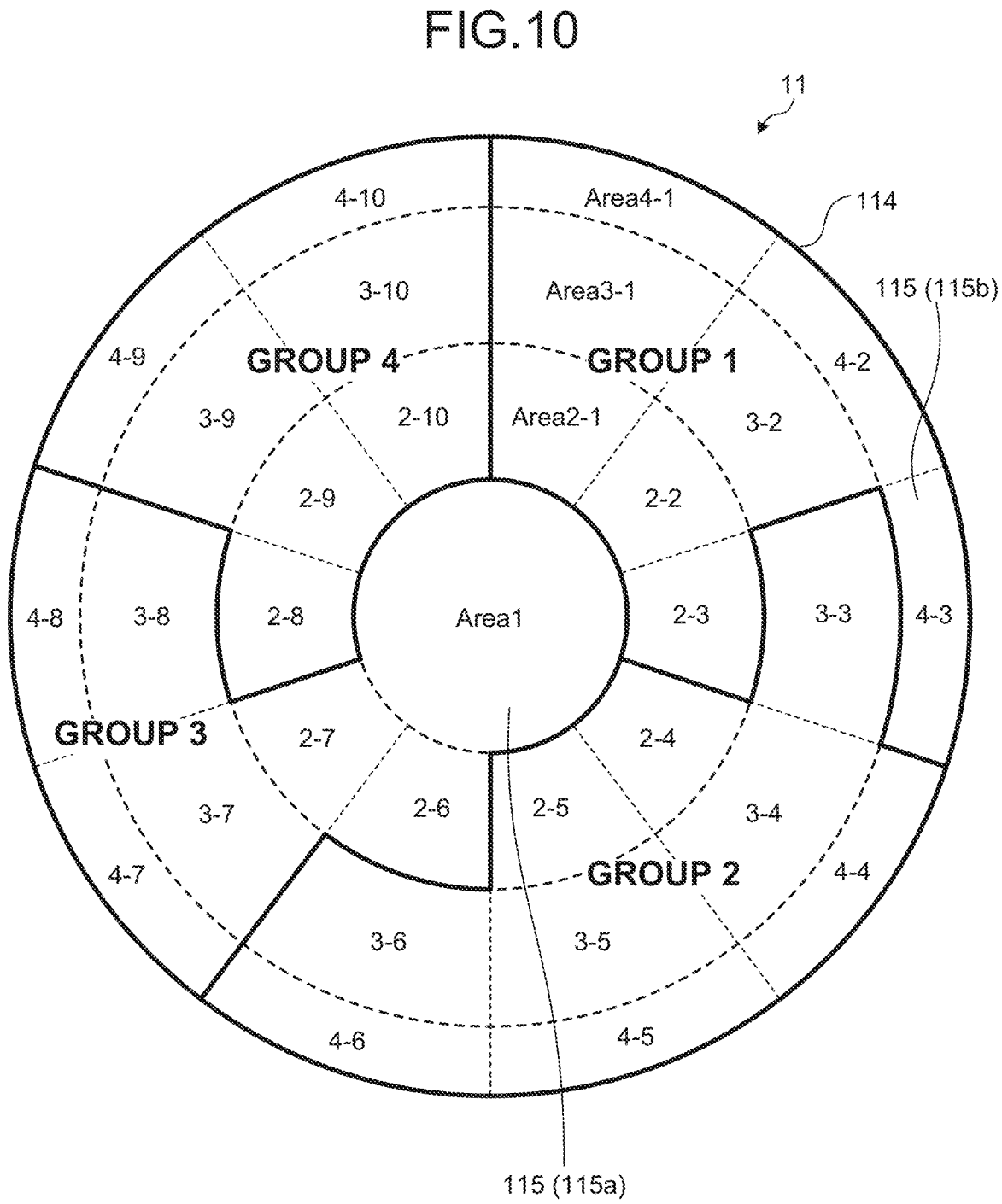
FIG. 10 is a diagram illustrating one example of grouping according to the embodiment.

FIG. 10 is a diagram illustrating one example of grouping according to the embodiment. In FIG. 10, a case is indicated where the zones 115 of the areas 1, 2-1 to 2-10, 3-1 to 3-10, and 4-1 to 4-10 are divided into four groups 1 to 4. In FIG. 10, boundaries between the groups 1 to 4 are indicated by using solid lines. The group 1 is constituted of the areas 2-1 to 2-3, 3-1, 3-2, and 4-1 to 4-3. The group 2 is constituted of the areas 2-4, 2-5, 3-3 to 3-6, and 4-4 to 4-6. The group 3 is constituted of the areas 1, 2-6, 2-7, 3-7, 3-8, 4-7, and 4-8. The group 4 is constituted of the areas 2-8 to 2-10, 3-9, 3-10, 4-9, and 4-10. The groups 1 to 4 correspond to a first heater electrode layer group and a second heater electrode layer group according to the present disclosure.

With respect to the groups 1 to 4 divided as described above, in order to restrict the maximum electric current supplied from the power source 130 to small one, a timing of the possible time interval ΔT of each of the zones 115 during a single period is assigned to each of the groups 1 to 4. In the embodiment, in each of the groups 1 to 4, a possible time interval for power supply with respect to each of the heaters 116 is decided such that a total of current values flowing through the heaters 116 by power supply is equalized during a single period.

Figure 11:
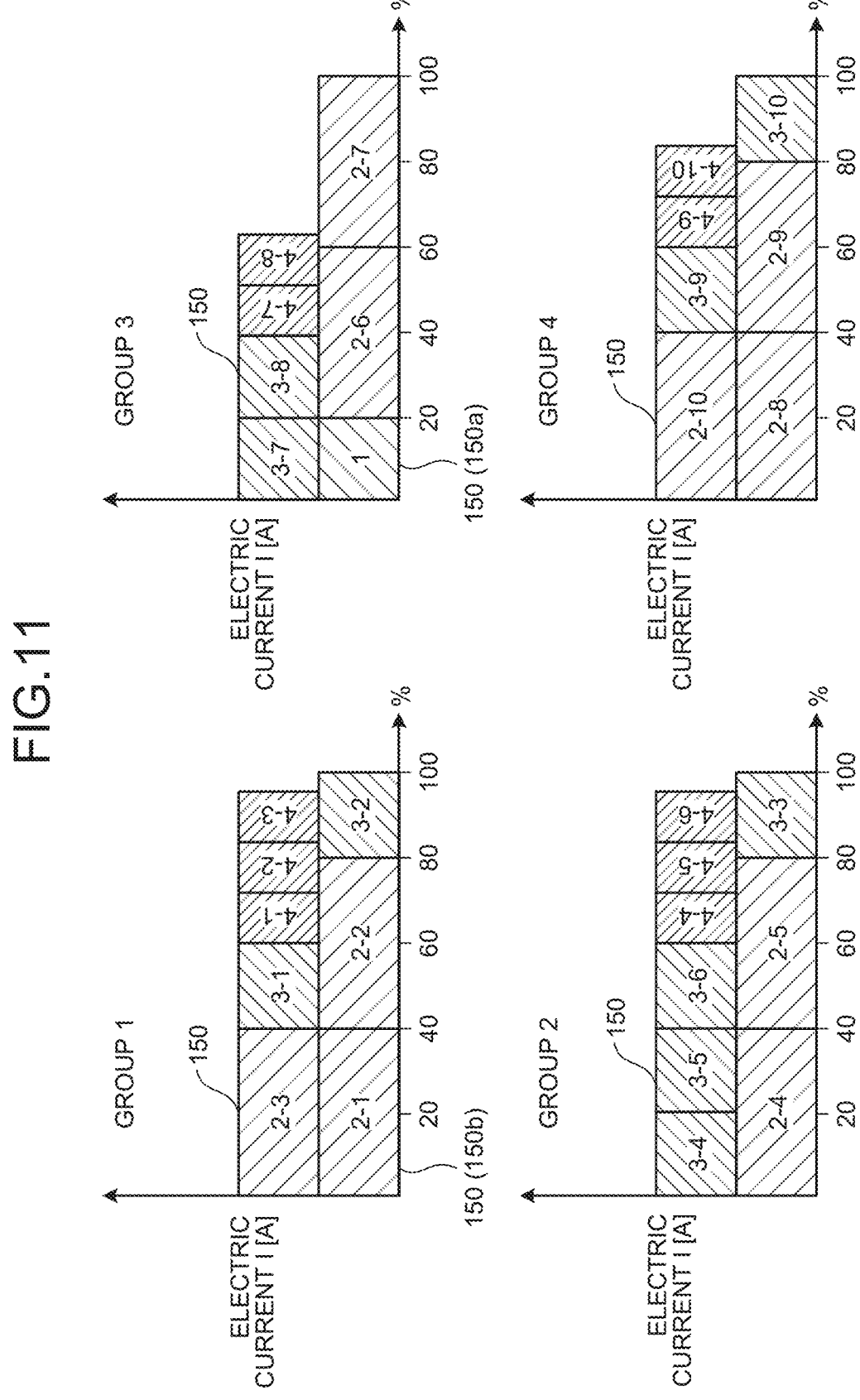
FIG. 11 is a diagram illustrating assignment examples of respective possible time intervals for power supply to zones for each of groups according to the embodiment.

FIG. 11 is a diagram illustrating assignment examples of respective possible time intervals for power supply to the zones 115 for each of the groups 1 to 4 according to the embodiment. In FIG. 11, by using the quadrangular blocks 150 illustrated in FIG. 9, there are illustrated timings of a possible time interval for power supply of each of the zones 115 during a single period and changes in current values in supplying electric power with respect to the groups 1 to 4.

In the present embodiment, a case is exemplified in which a period in supplying electric power by time division to the heaters 116 in each of the zones 115 is 100 (msec). However, a period of the time division can be changed. In FIG. 11, possible time intervals for power supply of the zones 115 during a single period are indicated by using ratios (%) while illustrating a time interval of the single period as 100% so as to respond to a case where a period is changed. In a case where a time interval of a single period is set to 100 (msec), a ratio (%) of a possible time interval for power supply becomes a time interval of (msec) having a value of the ratio itself.

As illustrated in FIG. 11, for example, in the group 1, possible time intervals for power supply of the areas 2-1 and 2-3 in the zone 115 are set to a time interval of 0 to 40% of a single period. In the group 1, a time interval of 40 to 60% of a single period is set to a possible time interval for power supply of the area 2-2 of the zone 115, and a time interval of 80 to 100% of the single period is set to a possible time interval for power supply of the area 3-2 in the zone 115. In the group 1, a time interval of 40 to 60% of the single period is set to a possible time interval for power supply of the area 3-1 in the zone 115. In the group 1, a time interval of 60 to 72% of the single period is set to a possible time for power supply interval of the area 4-1 in the zone 115, a time interval of 72 to 84% of the single period is set to a possible time interval for power supply of the area 4-2 in the zone 115, and a time interval of 84 to 96% of the single period is set to a possible time interval for power supply of the area 4-3 in the zone 115. Thus, it is possible to supply, for each single period, electric power to the heaters 116 of each of the zones 115 in the group 1. Moreover, it is further possible to restrict the maximum electric current supplied from the power source 130 to small one, and further to restrict electric power capacity of the power source 130 to small one.

Returning to FIG. 1, the controller 2 stores power-supply controlling information in the storage 2a2 in order to control power supply by time division to the zones 115. For example, as illustrated in FIG. 11, the controller 2 stores, in the storage 2a2 as power-supply controlling information, possible time intervals for power supply of the zones 115 and a delay value from the beginning of the single period until a start of a possible time interval for power supply.

FIG. 12 is a diagram illustrating one example of power-supply controlling information according to the embodiment. The power-supply controlling information includes items of an area, a group, a possible time interval for power supply, and a delay.

An item of an area is a region that stores therein an area for identifying the zone 115. An item of a group is a region that stores therein a group of an area in the zone 115. An item of a possible time interval for power supply is a region that stores therein a length of a possible time interval for power supply during a single period in supplying electric power to the zone 115. An item of a delay is a region that stores therein a delay from start of a single period until start of a possible time interval for power supply. In order to respond to change in a period of time division, the items of a possible time interval for power supply and a delay are stored as a ratio (%) during a single period while referring a time interval of the single period as 100%.

Power-supply controlling information stores information on the zones 115 of the groups 1 to 4. For example, in FIG. 12, the power-supply controlling information stores information on the zones 115 of the groups 1 to 4 illustrated in FIG. 11. A fact that the zone 115 in the area 1 belongs to the group 3, a possible time interval for power supply thereof is 20%, and a delay from start of a single period until start of a possible time interval for power supply is 0, is stored. A fact that the zone 115 in the area 2-1 belongs to the group 1, a possible time interval for power supply thereof is 40%, and a delay from start of a single period until start of a possible time interval for power supply is 0% is stored. A fact that the zone 115 in the area 2-2 belongs to the group 1, a possible time interval for power supply thereof is 40%, and a delay from start of a single period until start of a possible time interval for power supply is 40% is stored.

The controller 2 executes feed-back control on electric power to be supplied to the heaters 116 for each of the zones 115 such that the corresponding zone 115 has a specified temperature. For example, in the controller 2, information indicating a temperature is input to the controller 2 from the temperature sensors sns provided to the respective zones 115. The controller 2 specifies a difference between a temperature detected by the temperature sensor sns and a specified temperature for each of the zones 115. Next, the controller 2 executes, on the basis of the power-supply controlling information, control for supplying electric power by time division to the heater 116 in accordance with the specified difference for each of the zones 115.

Figure 13:
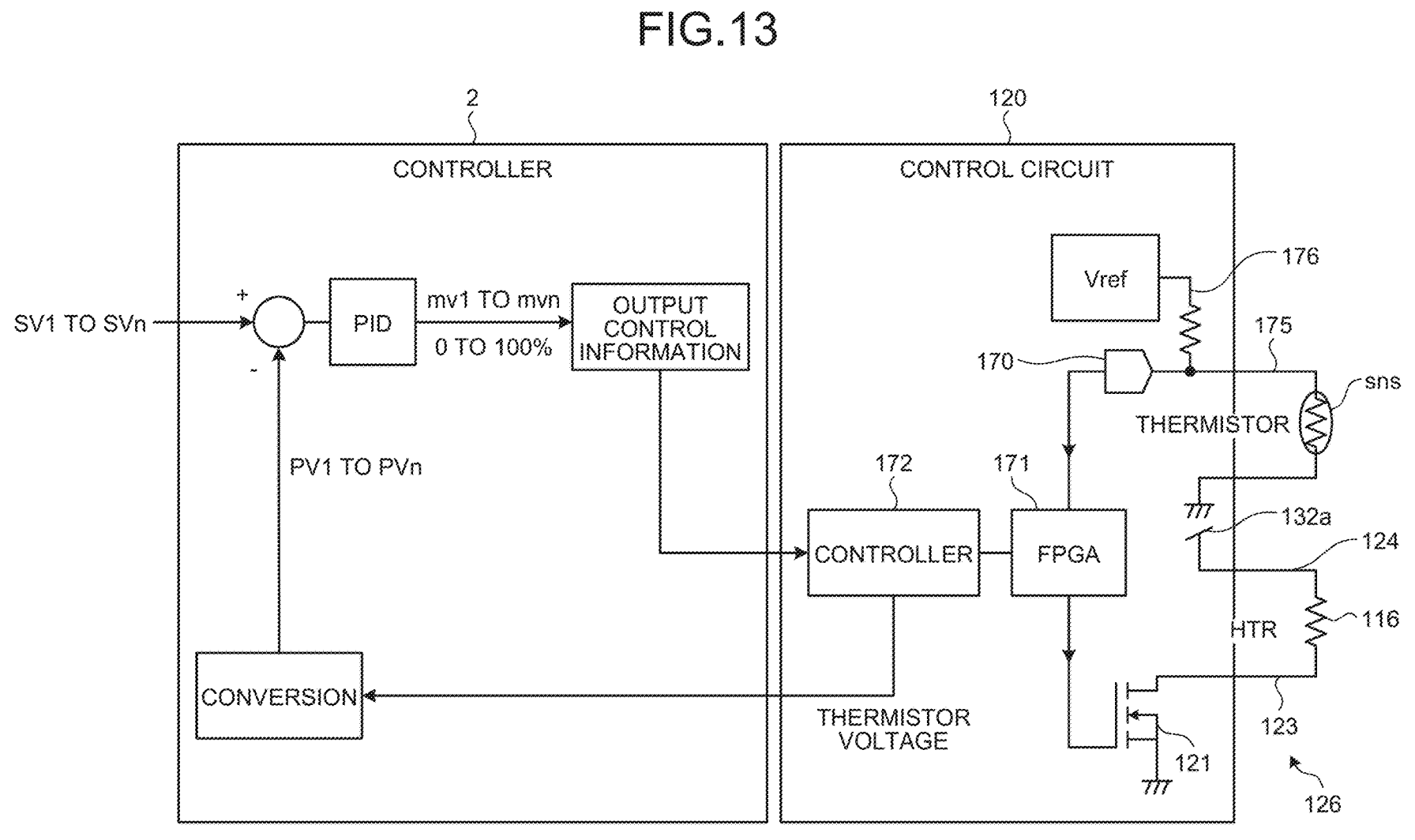

FIG. 13 is a diagram illustrating one example of temperature control according to the embodiment. In FIG. 13, there is illustrated the outline of a procedure for controlling the temperature of one of the zones 115 in the electrostatic chuck 1111. The heater 116 and the temperature sensor sns are provided in the zone 115.

The control circuit 120 is provided with the switch 121, an analog/digital converter (ADC) 170, a Field Programmable Gate Array (FPGA) 171, and a controller 172 such as a CPU and a microcomputer. The ADCs 170 are provided for the respective zones 115.

The heater 116 is connected to the switch 121 via the wire 123, and further is connected to the power supply line 132a via the wire 124. The power supply line 132a is connected to the power source 130, and a DC voltage is applied thereto. The switch 121 is connected to the FPGA 171. The FPGA 171 is connected to the controller 172. The FPGA 171 turns ON/OFF the switch 121 in response to control executed from the controller 172.

The temperature sensor sns is connected to the ADC 170 via a wire 175. A wire 176, which is connected to a predetermined reference voltage, is connected to the wire 175. The ADC 170 is connected to the FPGA 171. The temperature sensor sns is a thermistor, for example. A resistance value of the temperature sensor sns changes in accordance with the temperature. Thus, a voltage level of the wire 175 changes in accordance with a resistance value of the temperature sensor sns. The ADC 170 executes AD-conversion on a voltage of the wire 175, and further outputs data indicating a voltage value to the FPGA 171. The FPGA 171 outputs data indicating the voltage value to the controller 172.

The controller 172 receives data indicating a voltage value from the FPGA 171 of each of the zones 115. The controller 172 is connected to the controller 2. The controller 172 outputs data indicating voltage values of the zones 115 to the controller 2.

The controller 2 receives data indicating the voltage values of the zones 115 from the controller 172. The controller 2 converts data indicating voltage values of the zones 115 into temperatures of the temperature sensors sns. For example, the controller 2 stores therein conversion data indicating relation between a voltage value and a temperature of the temperature sensor sns. On the basis of the conversion data, the controller 2 converts voltage values of the zones 115 into temperatures PV1 to PVn ("n" is the number of zones 115) of the temperature sensors sns.

The controller 2 control power supply to the heaters 116 of the zones 115 in accordance with the temperatures PV1 to PVn of the temperature sensors sns. For example, the controller 2 receives specific temperatures SV1 to SVn for each of the zones 115. The controller 2 obtains differences between the temperatures PV1 to PVn of the temperature sensors sns and the specific temperatures SV1 to SVn for each of the zones 115 so as to obtain, by using PID control, operation amounts mv1 to mvn of the zones 115.

On the basis of the power-supply controlling information, the controller 2 obtains a ratio of a power supplying time interval of each of the zones 115 from the operation amounts mv1 to mvn of the zones 115. For example, the controller 2 multiplies the operation amount my by a possible time interval for power supply for each of the zones 115 so as to obtain a corresponding ratio of the power supplying time interval. For example, in a case where the operation amount my is 100% with respect to the zone 115 in the area 1 illustrated in FIG. 12, the controller 2 calculates "20%× 100%" so as to obtain result that a ratio of a power supplying time interval is 20%.

The controller 2 sets an electric-power applying period as a period of time division. The electric-power applying period can be set within a range of 10 to 200 (msec) in units of 10 (msec), for example.

The controller 2 outputs, to the controller 172, control information for controlling power supply to the heaters 116 in the zones 115. For example, the controller 2 outputs as control information, to the controller 172, an electric-power applying period, delay values of the zones 115, and ratios of the power supplying time interval of the zones 115. For example, in a case of the area 1 illustrated in FIG. 12, the controller 2 outputs in addition to an electric-power applying period, to the controller 172, 0% as a delay value and 20% as a ratio of a power supplying time interval.

On the basis of control information, the controller 172 executes control for supplying power to the heaters 116 in the zones 115. For example, the controller 172 multiplies a delay value by an electric-power applying period for each of the zones 115 so as to obtain delay time intervals of the zones 115. Moreover, the controller 172 multiplies a ratio of a power supplying time interval by an electric-power apply- ing period for each of the zones 115 so as to obtain power supplying time intervals of the zones 115. For example, in a case where an electric-power applying period is 100 (msec) in the area 1, the controller 172 calculates 100 (msec)×0% so as to obtain a delay time interval of 0 (msec). The controller 172 calculates "100 (msec)×20%" so as to obtain result that a power supplying time interval is 20 (msec).

The controller 172 outputs, to the FPGA 171, an instruc- tion for turn on the switch 121 for a power supplying time interval with a period of an electric-power applying period while providing a delay time interval. In response to the input instruction, the FPGA 171 turns on the switch 121 for a power supplying time interval while providing a delay time interval. Thus, the heater 116 in each of the zones 115 is turned on for a time interval corresponding to a ratio according to the operation amount my during the possible time interval for power supply illustrated in FIG. 11.

As described above, the plasma processing apparatus 1 supplies electric power to the heaters 116 by time division. Thus, power supply to the heaters 116 can be equalized, so that the plasma processing apparatus 1 is capable of pre- venting increase in electric power capacity of the power source 130 that supplies electric power to the heaters 116 even when the number of the heaters 116 is increased.

The assignment of possible time intervals for power supply to the zones 115 for each of the groups 1 to 4 illustrated in FIG. 11 is merely one example, and not limited thereto. In the groups 1 to 4, possible time intervals for power supply in the zones 115 may be exchanged to each other. A start timing of a possible time interval for power supply may be shifted forward or backward so as not to overlapped with a start timing of another possible time interval for power supply. Herein, in a case where a possible time interval for power supply continues in the zones 115 that are in the same centric circle and further are adjacent to each other, the temperature rises due to heat transfer between the zones 115 in the adjacent zones 115 whose possible time intervals for power supply are continuous, and thus the temperature of a portion of the concentric circle excessively rises in some cases. It is preferable that the temperature of a substrate is comparable within a concentric circle. possible time intervals for power supply of the zones 115 within a single period may be set such that possible time intervals for power supply of the adjacent zones 115 in the same con- centric circle do not continue. Moreover, possible time intervals for power supply of the zones 115 within a single period may be set such that possible time intervals for power supply of the plurality of zones 115 in adjacent concentric circles continue.

Figure 14:
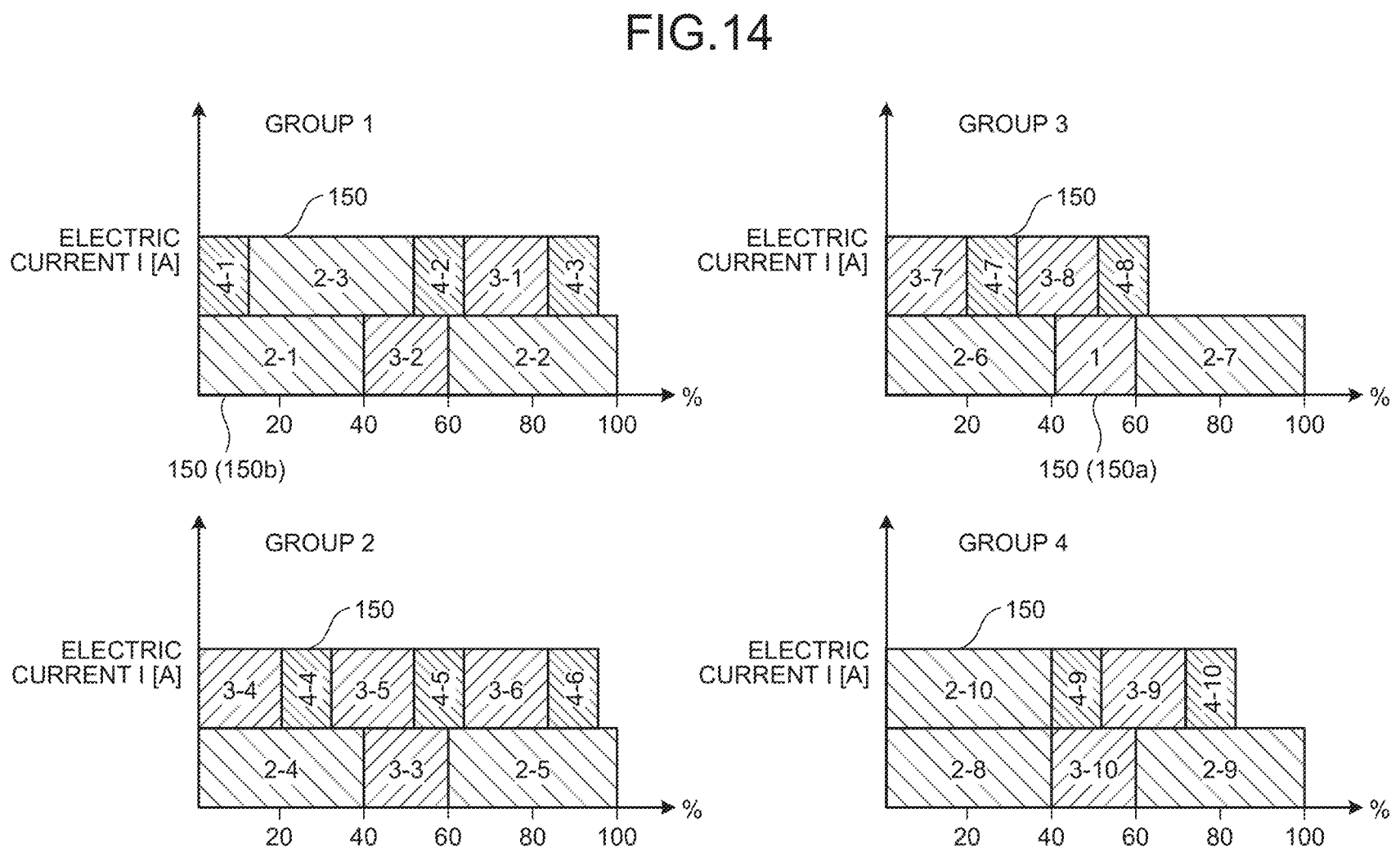

FIG. 14 is a diagram illustrating another assignment examples of respective possible time intervals for power supply to the zones 115 for each of the groups 1 to 4 according to the embodiment. In FIG. 14, possible time intervals for power supply of the zones 115 within a single period are set such that possible time intervals for power supply of the adjacent zones 115 in the same concentric circle do not continue. For example, in the group 1, a possible time interval for power supply of the area 3-2 is assigned between possible time intervals for power supply of the area 2-1 and the area 2-2. possible time intervals for power supply of the area 2-1 and the area 2-2, which are adjacent to each other in the same concentric circle, are set not to continue. Moreover, possible time intervals for power supply of the area 3-2 and the area 2-2, which are in adjacent concentric circles, are set to continue. Thus, it is possible to prevent an excessive raise in the temperature of a portion including the area 2-1 and the area 2-2 in the area 2 that are in a concentric circle.

Figure 15:
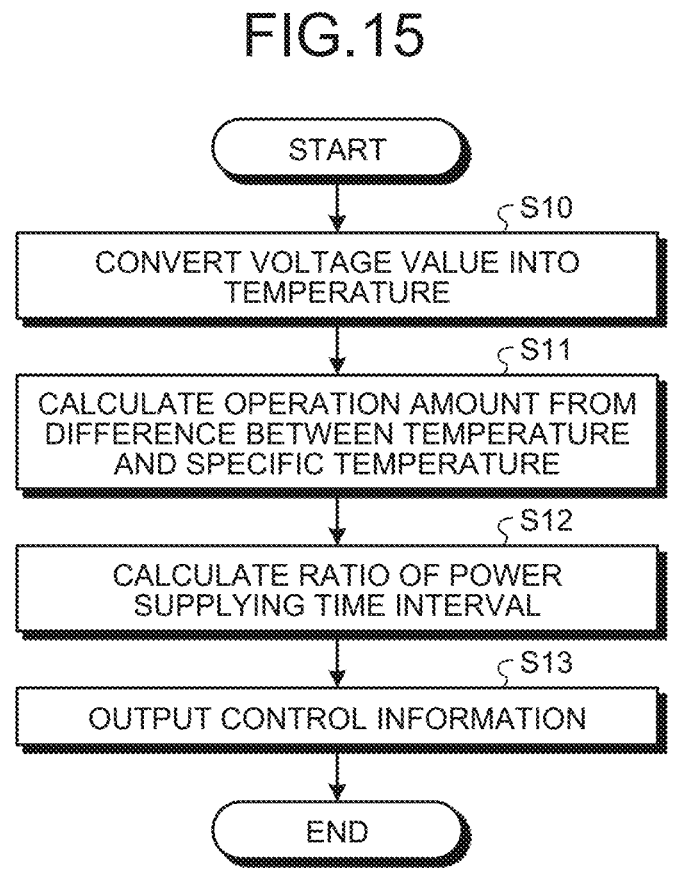

Next, a processing procedure of a temperature controlling method to be executed by the plasma processing apparatus 1 according to the embodiment will be explained. FIG. 15 is a diagram illustrating one example of a processing order of a temperature controlling method according to the embodi- ment. Processing in the temperature controlling method illustrated in FIG. 15 is executed when the controller 172 receives data indicating voltage values of the zones 115.

The controller 2 converts data indicating voltage values of the zones 115 into temperatures of the temperature sensors sns (Step S10). For example, on the basis of the converted data, the controller 2 converts voltage values of the zones 115 into the temperatures PV1 to PVn of the temperature sensors sns.

The controller 2 calculates, for each of the zones 115, differences between the temperatures PV1 to PVn of the temperature sensors sns and the specific temperatures SV1 to SVn so as to obtain the operation amounts mv1 to mvn of the zones 115 by using PID control (Step S11).

On the basis of power-supply controlling information, the controller 2 calculates ratios of power supplying time intervals of the zones 115 from the operation amount mv1 to mvn of the zones 115 (Step S12).

The controller 2 outputs, to the controller 172, control information for controlling power supply to the heaters 116 of the zones 115 (Step S13), and further ends the processing. For example, the controller 2 outputs to the controller 172, as control information, an electric-power applying period, delay values of the zones 115, and ratios of power supplying time intervals of the zones 115.

As described above, the plasma processing apparatus 1 according to the embodiment includes: the plasma processing chamber 10, the base 1110, the electrostatic chuck 1111, a first heater electrode layer group, a second heater electrode layer group, the power source 130, and controller 2. The base 1110 disposed in the plasma processing chamber 10. The electrostatic chuck 1111 disposed on an upper portion of the base 1110, the electrostatic chuck 1111 including a first part and a second part. The first heater electrode layer group including at least one heater electrode layer disposed in the first part. The second heater electrode layer group including at least one heater electrode layer disposed in the second part. The power source 130 is electrically connected to the first heater electrode layer group and the second heater electrode layer group. The controller 2 configured to periodically and sequentially supply DC current from the power source 130 to heater electrode layers included in the first heater electrode layer group and heater electrode layers included in the second heater electrode layer group. Thus, the plasma processing apparatus 1 is capable of preventing increase in electric power capacity of the power source 130 that supplies electric power to heater electrode layers even when the number of the heater electrode layers is increased.

At least one of the first heater electrode layer group and the second heater electrode layer group includes: a heater electrode layer disposed in a central portion of the electrostatic chuck 1111; and a heater electrode layer that disposed in a ring-shaped portion surrounding the central portion. Thus, the plasma processing apparatus 1 is capable of executing temperature control on a central portion and a ring-shaped portion of the electrostatic chuck 1111.

Electrode layers of the first heater electrode layer group are electrically connected to a first power supply line in parallel via respective first switches. Electrode layers of the second heater electrode layer group are electrically connected to a second power supply line in parallel via respective second switches. The first power supply line and the second power supply line are connected to the power source 130 in parallel. The controller 2 is further configured to: execute control for periodically and sequentially turn on the first switches and the second switches. Thus, the plasma processing apparatus 1 is capable of supplying electric power by time division to electrode layers of the first heater electrode layer group and electrode layers of the second heater electrode layer group, so that it is possible to restrict the maximum value of electric current flowing into the first power supply line and the second power supply line to small one.

At least one of the RF filters 140 is disposed between the power source 130 and each of power supply lines of respective electrode layers of the first heater electrode layer group and the second heater electrode layer group. Thus, the plasma processing apparatus 1 is capable of protecting the power source 130 from high-frequency noise.

The first power supply line and the second power supply line are connected in parallel to a main power-supply line (main power-supply lines 131a and 131b) connected to the power source 130. The at least one RF filter 140 is electrically connected to the main power-supply line. Thus, the plasma processing apparatus 1 is capable of reducing the number of the RF filters 140 while protecting the power source 130 from high-frequency noise.

A possible time interval for power, during which each of the heater electrode layers can be powered, is set within a single period for the first heater electrode layer group and the second heater electrode layer group. The controller 2 is further configured to supply, for each single period, DC current from the power supply to each of heater electrode layers included in the first heater electrode layer group and each of heater electrode layers included in the second heater electrode layer group during the possible time interval for power supply. Thus, the plasma processing apparatus 1 is capable of periodically supplying electric power to heater electrode layers by time division.

For each of the first heater electrode layer group and the second heater electrode layer group, the possible time interval for power supply with respect to each of the heater electrode layers is set such that a total of current values flowing through the heater electrode layers by power supply is equalized during a single period. Thus, the plasma processing apparatus 1 is capable of restricting the maximum electric current to be supplied from the power source 130 to small one, so that it is possible to restrict electric power capacity of the power source 130 to small one.

The placement surface 114 of the electrostatic chuck 1111, on which the substrate W is placed, is formed in circle-shaped. The heater electrode layers are respectively arranged in a center region of the placement surface 114 of the electrostatic chuck 1111 and arc-shaped regions obtained by sectioning each of a plurality of ring-shaped regions that is formed in concentric circle-shaped each surrounding the center region. At least one of the first heater electrode layer group and the second heater electrode layer group includes the adjacent arc-shaped regions in a same concentric circle, and the possible time intervals for power supply of the adjacent arc-shaped regions are set not to continue. The placement surface 114 of the electrostatic chuck 1111, on which a substrate is placed, is formed in circle-shaped. The heater electrode layers are respectively arranged in a center region of the placement surface 114 of the electrostatic chuck 1111 and arc-shaped regions obtained by sectioning each of a plurality of ring-shaped regions that is formed in concentric circle-shaped each surrounding the center region. At least one of the first heater electrode layer group and the second heater electrode layer group includes the arc-shaped regions in adjacent concentric circles, and the possible time intervals for power supply of the arc-shaped regions in the adjacent concentric circles are set to continue. Thus, the plasma processing apparatus 1 is capable of preventing an excessive raise in the temperature of a portion of a concentric circle in the placement surface 114.

Resistance values and possible time intervals for power supply of the heater electrode layers are decided such that in a case where electric power is supplied for a possible time intervals for power supply corresponding to a ratio of the corresponding possible time interval for power supply of each of the heater electrode layers, a comparable rise in temperature is obtained. Thus, the plasma processing apparatus 1 evenly controls a ratio of a possible time interval for power supply of each of heater electrode layers, so that it is possible to evenly raise temperatures of the heater electrode layers.

The temperature sensor sns are disposed in the electrostatic chuck 1111 corresponding to the respective heater electrode layers. The controller 2 is further configured to a time of power supply for supplying electric power during a possible time interval for power supply of the heater electrode layer corresponding to the temperature sensor sns in accordance with a temperature detected by each of the temperature sensors sns. Thus, the plasma processing apparatus 1 is capable of controlling temperatures of parts (zones 115) in which respective heater electrode layers are arranged, so as to obtain target temperatures.

So far, the embodiment has been explained; however, additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

For example, in the above-mentioned embodiment, the case has been explained, as an example, in which a plasma process is executed on the substrate W as a semiconductor wafer; however, not limited thereto. The substrate W may be anything.

Moreover, in the above-mentioned embodiment, a plasma processing system that executes a plasma etching process has been exemplified; however, not limited thereto. Any apparatus may be employed as long as the heaters 116 and the temperature sensors sns are provided to the respective zones 115 obtained by sectioning the placement surface 114 of the electrostatic chuck 1111 so as to execute a plasm process. For example, the plasma processing apparatus may be a film forming apparatus or the like that generates plasma so as to form a film.

According to the present disclosure, it is possible to reduce increase in electric power capacity of a power source that supplies electric power to heaters even in a case where the number of the heaters is increased.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

Note that regarding the above-mentioned embodiment, the following supplementary notes are disclosed.

(Supplementary Note 1)

A plasma processing apparatus including:

a plasma processing chamber;

a base disposed in the plasma processing chamber;

an electrostatic chuck disposed on an upper portion of the base, the electrostatic chuck including a first part and a second part;

a first heater electrode layer group including at least one heater electrode layer disposed in the first part;

a second heater electrode layer group including at least one heater electrode layer disposed in the second part;

a power source electrically connected to the first heater electrode layer group and the second heater electrode layer group; and a controller configured to periodically and sequentially supply DC current from the power source to heater electrode layers included in the first heater electrode layer group and heater electrode layers included in the second heater electrode layer group.

(Supplementary Note 2)

The plasma processing apparatus according to Supplementary Note 1, wherein at least one of the first heater electrode layer group and the second heater electrode layer group includes:

a heater electrode layer disposed in a central portion of the electrostatic chuck; and a heater electrode layer disposed in a ring-shaped portion surrounding the central portion.

(Supplementary Note 3)

The plasma processing apparatus according to Supplementary Note 1 or 2, wherein electrode layers of the first heater electrode layer group are electrically connected to a first power supply line in parallel via respective first switches, electrode layers of the second heater electrode layer group are electrically connected to a second power supply line in parallel via respective second switches, the first power supply line and the second power supply line are connected to the power source in parallel, and the controller is further configured to:

execute control for periodically and sequentially turn on the first switches and the second switches.

(Supplementary Note 4)

The plasma processing apparatus according to any one of Supplementary Notes 1 to 3, wherein at least one of RF filters is disposed between the power source and each of power supply lines of respective electrode layers of the first heater electrode layer group and the second heater electrode layer group.

(Supplementary Note 5)

The plasma processing apparatus according to Supplementary Note 3, wherein the first power supply line and the second power supply line are connected in parallel to a main power-supply line connected to the power source, and at least one RF filter is electrically connected to the main power-supply line.

(Supplementary Note 6)

The plasma processing apparatus according to any one of Supplementary Notes 1 to 5, wherein a possible time interval for power supply, during which each of the heater electrode layers can be powered, is set within a single period for the first heater electrode layer group and the second heater electrode layer group, and the controller is further configured to supply, for each single period, DC current from the power supply to each of heater electrode layers included in the first heater electrode layer group and each of heater electrode layers included in the second heater electrode layer group during the possible time interval for power supply.

(Supplementary Note 7)

The plasma processing apparatus according to Supplementary Note 6, wherein for each of the first heater electrode layer group and the second heater electrode layer group, the possible time interval for power supply with respect to each of the heater electrode layers is set such that a total of current values flowing through the heater electrode layers by power supply is equalized during a single period.

(Supplementary Note 8)

The plasma processing apparatus according to Supplementary Note 6 or 7, wherein a placement surface of the electrostatic chuck, on which a substrate is placed, is formed in circle-shaped, the heater electrode layers are respectively arranged in a center region of the placement surface of the electrostatic chuck and arc-shaped regions obtained by sectioning each of a plurality of ring-shaped regions that is formed in concentric circle-shaped each surrounding the center region, and at least one of the first heater electrode layer group and the second heater electrode layer group includes the adjacent arc-shaped regions in a same concentric circle, and the possible time intervals for power supply of the adjacent arc-shaped regions are set not to continue.

(Supplementary Note 9)

The plasma processing apparatus according to Supplementary Note 6 or 7, wherein a placement surface of the electrostatic chuck, on which a substrate is placed, is formed in circle-shaped, the heater electrode layers are respectively arranged in a center region of the placement surface of the electrostatic chuck and arc-shaped regions obtained by sectioning each of a plurality of ring-shaped regions that is formed in concentric circle-shaped each surrounding the center region, and at least one of the first heater electrode layer group and the second heater electrode layer group includes the arc-shaped regions in adjacent concentric circles, and the possible time intervals for power supply of the arc-shaped regions in the adjacent concentric circles are set to continue.

(Supplementary Note 10)

The plasma processing apparatus according to any one of Supplementary Notes 6 to 9, wherein resistance values and possible time intervals for power supply of the heater electrode layers are decided such that in a case where electric power is supplied for a time of power supply corresponding to a ratio of the corresponding possible time interval for power supply of each of the heater electrode layers, a comparable rise in temperature is obtained.

(Supplementary Note 11)

The plasma processing apparatus according to any one of Supplementary Notes 1 to 10, wherein temperature sensors are disposed in the electrostatic chuck corresponding to the respective heater electrode layers, and the controller is further configured to a time of power supply for supplying electric power during a possible time interval for power supply of the heater electrode layer corresponding to the temperature sensor in accordance with a temperature detected by each of the temperature sensors.

(Supplementary Note 12)

A temperature controlling method to be executed by a plasma processing apparatus, the apparatus including:

a plasma processing chamber;

a base disposed in the plasma processing chamber;

an electrostatic chuck disposed on an upper portion of the base, the electrostatic chuck including a first part and a second part;

a first heater electrode layer group including at least one heater electrode layer disposed in the first part;

a second heater electrode layer group including at least one heater electrode layer disposed in the second part; and a power source that is electrically connected to the first heater electrode layer group and the second heater electrode layer group; and the method includes:

executing control for causing the power source to periodically and sequentially supply DC current to heater electrode layers included in the first heater electrode layer group and heater electrode layers included in the second heater electrode layer group.

What is claimed is:

1. A plasma processing apparatus comprising:
a plasma processing chamber;
a base disposed in the plasma processing chamber;
an electrostatic chuck disposed on an upper portion of the base, the electrostatic chuck including a first part and a second part;
a first heater electrode layer group including at least one heater electrode layer disposed in the first part;
a second heater electrode layer group including at least one heater electrode layer disposed in the second part;
a power source electrically connected to the first heater electrode layer group and the second heater electrode layer group; and
a controller configured to periodically and sequentially supply DC current from the power source to heater electrode layers included in the first heater electrode layer group and heater electrode layers included in the second heater electrode layer group.

2. The plasma processing apparatus according to claim 1, wherein
at least one of the first heater electrode layer group and the second heater electrode layer group includes:
a heater electrode layer disposed in a central portion of the electrostatic chuck; and
a heater electrode layer disposed in a ring-shaped portion surrounding the central portion.

3. The plasma processing apparatus according to claim 1, wherein
electrode layers of the first heater electrode layer group are electrically connected to a first power supply line in parallel via respective first switches,
electrode layers of the second heater electrode layer group are electrically connected to a second power supply line in parallel via respective second switches,
the first power supply line and the second power supply line are connected to the power source in parallel, and
the controller is further configured to periodically and sequentially turn on the first switches and the second switches.

4. The plasma processing apparatus according to claim 1, wherein
at least one of RF filters is disposed between the power source and each of power supply lines of respective electrode layers of the first heater electrode layer group and the second heater electrode layer group.

5. The plasma processing apparatus according to claim 3, wherein
the first power supply line and the second power supply line are connected in parallel to a main power-supply line connected to the power source, and
at least one RF filter is electrically connected to the main power-supply line.

6. The plasma processing apparatus according to claim 1, wherein
a possible time interval for power supply, during which each of the heater electrode layers can be powered, is set within a single period for the first heater electrode layer group and the second heater electrode layer group, and the controller is further configured to supply, for each single period, DC current from the power supply to each of heater electrode layers included in the first heater electrode layer group and each of heater electrode layers included in the second heater electrode layer group during the possible time interval for power supply.

7. The plasma processing apparatus according to claim 6, wherein for each of the first heater electrode layer group and the second heater electrode layer group, the possible time interval for power supply with respect to each of the heater electrode layers is set such that a total of current values flowing through the heater electrode layers by power supply is equalized during a single period.

8. The plasma processing apparatus according to claim 6, wherein a placement surface of the electrostatic chuck, on which a substrate is placed, is formed in circle-shaped, the heater electrode layers are respectively disposed in a center region of the placement surface of the electrostatic chuck and arc-shaped regions obtained by sectioning each of a plurality of ring-shaped regions formed in concentric circle-shaped each surrounding the center region, and at least one of the first heater electrode layer group and the second heater electrode layer group includes the adjacent arc-shaped regions in a same concentric circle, and the possible time intervals for power supply of the adjacent arc-shaped regions are set not to continue.

9. The plasma processing apparatus according to claim 6, wherein a placement surface of the electrostatic chuck, on which a substrate is placed, is formed in circle-shaped, the heater electrode layers are respectively disposed in a center region of the placement surface of the electrostatic chuck and arc-shaped regions obtained by sectioning each of a plurality of ring-shaped regions formed in concentric circle-shaped each surrounding the center region, and at least one of the first heater electrode layer group and the second heater electrode layer group includes the arc-shaped regions in adjacent concentric circles, and the possible time intervals for power supply of the arc-shaped regions in the adjacent concentric circles are set to continue.

10. The plasma processing apparatus according to claim 6, wherein resistance values and possible time intervals for power supply of the heater electrode layers are decided such that in a case where electric power is supplied for a time of power supply corresponding to a ratio of the corresponding possible time interval for power supply of each of the heater electrode layers, a comparable rise in temperature is obtained.

11. The plasma processing apparatus according to claim 1, wherein temperature sensors are disposed in the electrostatic chuck corresponding to the respective heater electrode layers, and the controller is further configured to control a time of power supply for supplying electric power during a possible time interval for power supply of the heater electrode layer corresponding to the temperature sensor in accordance with a temperature detected by each of the temperature sensors.

12. A temperature controlling method to be executed by a plasma processing apparatus, the apparatus comprising:

a plasma processing chamber;

a base disposed in the plasma processing chamber;

an electrostatic chuck disposed on an upper portion of the base, the electrostatic chuck including a first part and a second part;

a first heater electrode layer group including at least one heater electrode layer disposed in the first part;

a second heater electrode layer group including at least one heater electrode layer disposed in the second part; and a power source that is electrically connected to the first heater electrode layer group and the second heater electrode layer group; and the method comprises:

executing control for causing the power source to periodically and sequentially supply DC current to heater electrode layers included in the first heater electrode layer group and heater electrode layers included in the second heater electrode layer group.

* * * * *